United States Patent
Zhang et al.

(10) Patent No.: US 11,469,771 B2
(45) Date of Patent: Oct. 11, 2022

(54) METHOD AND APPARATUS FOR POINT CLOUD COMPRESSION

(71) Applicant: TENCENT AMERICA LLC, Palo Alto, CA (US)

(72) Inventors: Xiang Zhang, Sunnyvale, CA (US); Wen Gao, West Windsor, NJ (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 300 days.

(21) Appl. No.: 16/916,944

(22) Filed: Jun. 30, 2020

(65) Prior Publication Data

US 2021/0004991 A1 Jan. 7, 2021

Related U.S. Application Data

(60) Provisional application No. 62/869,946, filed on Jul. 2, 2019, provisional application No. 62/910,387, filed
(Continued)

(51) Int. Cl.
*H03M 7/30* (2006.01)
*H03M 7/42* (2006.01)
(Continued)

(52) U.S. Cl.
CPC .......... *H03M 7/3059* (2013.01); *H03M 7/42* (2013.01); *H03M 13/2927* (2013.01); *H04N 19/96* (2014.11); *G06T 9/40* (2013.01)

(58) Field of Classification Search
CPC .. H03M 7/3059; H03M 7/42; H03M 13/2927; H04N 19/96; G06T 9/40
(Continued)

(56) References Cited

U.S. PATENT DOCUMENTS

| 9,035,807 B2 | 5/2015 | Jiang et al. |
| 2013/0077684 A1 | 3/2013 | Chen et al. |

(Continued)

FOREIGN PATENT DOCUMENTS

| WO | 2017/209961 | 12/2017 |
| WO | 2017217191 A1 | 12/2017 |

OTHER PUBLICATIONS

Mekuria et al., "Requirements for Point Cloud Compression," n16330, Geneva, CH, Feb. 2016 (3 pages).
(Continued)

*Primary Examiner* — Allen C Wong
(74) *Attorney, Agent, or Firm* — ArentFox Schiff LLP

(57) ABSTRACT

Aspects of the disclosure provide methods, apparatuses, and a non-transitory computer-readable medium for point cloud compression and decompression. In a method, syntax information of a point cloud in a quantized space is decoded from a coded bitstream. The syntax information includes dividing information and adaptive geometry quantization information for a bounding box of the point cloud. The bounding box of the point cloud is divided into a plurality of parts based on the dividing information. Quantization parameters for the parts in the bounding box are determined based on the adaptive geometry quantization information. Points in each of the parts in the bounding box of the point cloud are reconstructed based on the quantization parameter for the respective part in the bounding box.

20 Claims, 12 Drawing Sheets

Related U.S. Application Data on Oct. 3, 2019, provisional application No. 62/958,131, filed on Jan. 7, 2020.

(51) Int. Cl.
  *H03M 13/29* (2006.01)
  *H04N 19/96* (2014.01)
  *G06T 9/40* (2006.01)

(58) Field of Classification Search
  USPC .......................................................... 341/79
  See application file for complete search history.

(56) References Cited

U.S. PATENT DOCUMENTS

| | | | |
|---|---|---|---|
| 2015/0146794 | A1 | 5/2015 | Hoang |
| 2016/0086353 | A1 | 3/2016 | Lukac et al. |
| 2017/0214943 | A1 | 7/2017 | Cohen et al. |
| 2017/0347100 | A1 | 11/2017 | Chou et al. |
| 2019/0318488 | A1* | 10/2019 | Lim .................... H04N 21/8547 |
| 2021/0118188 | A1* | 4/2021 | Zhang .................... H04N 19/70 |

OTHER PUBLICATIONS

Tulvan et al., "Use Cases for Point Cloud Compression (PCC)," N16331, Geneva, CH, Jun. 2016 (8 pages).

"G-PCC codec description v5," N18891, Geneva, CH, Jul. 2019 (75 pages).

Mammou et al., "G-PCC codec description v2," N18189, Marrakech, MA, Jan. 2019 (40 pages).

Information technology—MPEG-I (Coded Representation of Immersive Media)—Part 9: Geometry-based Point Cloud Compression, CD Stage, 2019 (104 pages).

Information Technology—MPEG-I(Coded Representation of Immersive Media)—Part 9: Geometry-based Point Cloud Compression, ISO/IEC/23090-9:2019(E), ISO/IECJTC1/SC29/WG11 (2019) (89 pages).

Zhang et al.—"[G-PCC] [New proposal] Implicit geometry partition for point cloud coding", International Organisation for Standardisation Organisation in Internationale De Normalisation, ISO/IEC JTC1/SC29/WG11, Coding of Moving Pictures and Audio, ISO/IEC JTC1/SC29/WG11 MPEG 2019/m49231, Jul. 2019, Gothenburg, Sweden (14 pages).

U.S. Appl. No. 62/867,063 "Implicit Geometry Partition for Point Cloud Coding", filed Jun. 26, 2019 (30 pages).

U.S. Appl. No. 62/869,946 "Signaling of QP variations for Adaptive Geometry Quantization in Point Cloud Coding", filed Jul. 2, 2019 (30 pages).

U.S. Appl. No. 62/904,384 "On Geometry for Point Clouds", filed Sep. 23, 2019 (22 pages).

International Search Report and Written Opinion dated Sep. 29, 2020 in International Application No. PCT/US2020/040328, (11 pages).

International Search Report and Written Opinion dated Sep. 3, 2020 in International Application No. PCT/US2020/070167, (13 pages).

Ranger, "Icosatree Data Partitioning of Massive Geospatial Point Clouds with User-Selectable Entities and Surface Modeling," Rochester Institute of Technology, Dec. 2016 (53 pages).

Indian Office Action dated Mar. 30, 2022 in Application No. 202147047431.

"G-PCC codec description v4," N18673, Gothenburg, SE, Jul. 2019 (63 pages).

Sébastien Lasserre & David Flynn, m48906_Planar mode in octree-based geometry coding, [PowerPoint slides], BlackBerry, 2016, 33 pages.

\* cited by examiner

FIG. 8A
FIG. 8B

METHOD AND APPARATUS FOR POINT CLOUD COMPRESSION

INCORPORATION BY REFERENCE

This present application claims the benefit of priority to U.S. Provisional Application No. 62/869,946, "SIGNALING OF QP VARIATIONS FOR ADAPTIVE GEOMETRY QUANTIZATION IN POINT CLOUD CODING" filed on Jul. 2, 2019, U.S. Provisional Application No. 62/910,387, "ADDITIONAL INFORMATION ON ADAPTIVE GEOMETRY QUANTIZATION AND IMPLICIT GEOMETRY PARTITION FOR POINT CLOUD CODING" filed on Oct. 3, 2019, and U.S. Provisional Application No. 62/958,131, "ADDITIONAL INFORMATION ON ADAPTIVE GEOMETRY QUANTIZATION AND PARALLEL OCTREE CODING FOR POINT CLOUD CODING" filed on Jan. 7, 2020, which are incorporated by reference herein in their entirety.

TECHNICAL FIELD

The present disclosure describes embodiments generally related to point cloud compression.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Various technologies are developed to capture and represent the world, such as objects in the world, environments in the world, and the like in 3-dimensional (3D) space. 3D representations of the world can enable more immersive forms of interaction and communication. Point clouds can be used as a 3D representation of the world. A point cloud is a set of points in a 3D space, each with associated attributes, e.g. color, material properties, texture information, intensity attributes, reflectivity attributes, motion related attributes, modality attributes, and various other attributes. Such point clouds may include large amounts of data and may be costly and time-consuming to store and transmit.

SUMMARY

Aspects of the disclosure provide methods for point cloud compression and decompression. In a method, syntax information of a point cloud in a quantized space is decoded from a coded bitstream. The syntax information includes dividing information and adaptive geometry quantization information for a bounding box of the point cloud. The bounding box of the point cloud is divided into a plurality of parts based on the dividing information. Quantization parameters for the parts in the bounding box are determined based on the adaptive geometry quantization information. Points in each of the parts in the bounding box of the point cloud are reconstructed based on the quantization parameter for the respective part in the bounding box.

In an embodiment, the bounding box is divided into a plurality of partitions based on an octree partition structure included in the dividing information.

In an embodiment, the bounding box is divided into a plurality of regions based on coordinate information of the plurality of regions included in the dividing information.

In an embodiment, the quantization parameters are determined based on a base quantization parameter included in the adaptive geometry quantization information.

In an embodiment, the quantization parameters are determined based on one or more delta quantization parameters in response to a first syntax element indicating that signaling of the one or more delta quantization parameters is enabled. The first syntax element is included in the adaptive geometry quantization information.

In an embodiment, the adaptive geometry quantization information includes one of a second syntax element and a third syntax element based on the first syntax element indicating that the signaling of the one or more delta quantization parameters is enabled. The second syntax element indicates an octree partition depth at which the signaling of the one or more delta quantization parameters is allowed, and the third syntax element indicates a minimum octree partition depth from which the signaling of the one or more delta quantization parameters is allowed.

In an embodiment, at least one of the quantization parameters, the base quantization parameter, and the one or more delta quantization parameters is a power of two.

In an embodiment, one of (i) the quantization parameters and (ii) the one or more delta quantization parameters is included in a look-up table.

In an embodiment, the adaptive geometry quantization information includes one of (i) an index of the look-up table and (ii) a difference between the index and a predictor of the index.

In an embodiment, a delta quantization parameter of each part in the bounding box is predicted based on at least one of a quantization parameter of a parent node of a node corresponding to the respective part, a quantization parameter of a previously coded sibling node of the node corresponding to the respective part in a same partition depth, and the base quantization parameter.

In an embodiment, the one or more delta quantization parameters are predicted based on a candidate list of quantization parameter predictors.

Aspects of the disclosure also provide apparatuses for point cloud compression and decompression. One apparatus includes processing circuitry that decodes syntax information of a point cloud in a quantized space from a coded bitstream. The syntax information includes dividing information and adaptive geometry quantization information for a bounding box of the point cloud. The processing circuitry divides the bounding box of the point cloud into a plurality of parts based on the dividing information. The processing circuitry determines quantization parameters for the parts in the bounding box based on the adaptive geometry quantization information. The processing circuitry reconstructs points in each of the parts in the bounding box of the point cloud based on the quantization parameter for the respective part in the bounding box.

Aspects of the disclosure also provide a non-transitory computer-readable medium storing instructions which when executed by a computer for point cloud compression/decompression cause the computer to perform any one or a combination of the methods for point cloud compression/decompression.

BRIEF DESCRIPTION OF THE DRAWINGS

Further features, the nature, and various advantages of the disclosed subject matter will be more apparent from the following detailed description and the accompanying drawings in which:

FIG. 8A shows constant quantization and lossless octree coding in some examples;

FIG. 8B shows an exemplary octree coding with adaptive quantization according to an embodiment of the disclosure;

DETAILED DESCRIPTION OF EMBODIMENTS

I. Point Cloud Compression Systems

Figure 1:
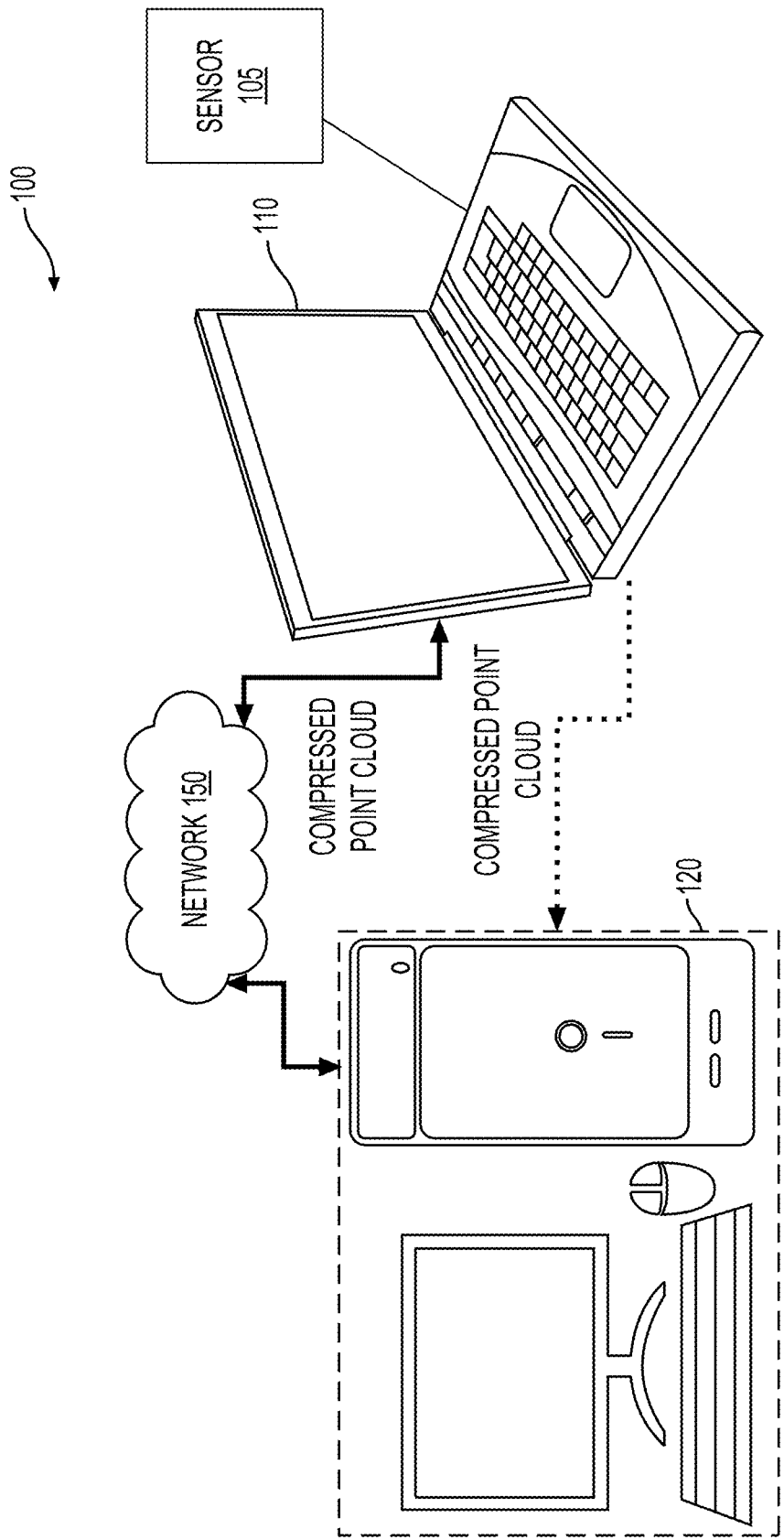
FIG. 1 shows a schematic illustration of a simplified block diagram of a communication system according to an embodiment of the disclosure.

FIG. 1 illustrates a simplified block diagram of a communication system (100) according to an embodiment of the present disclosure. The communication system (100) includes a plurality of terminal devices that can communicate with each other, via, for example, a network (150). For example, the communication system (100) includes a pair of terminal devices (110) and (120) interconnected via the network (150). In the FIG. 1 example, the first pair of terminal devices (110) and (120) perform unidirectional transmission of point cloud data. For example, the terminal device (110) may compress a point cloud (e.g., points representing a structure) that is captured by a sensor 105 connected with the terminal device (110). The compressed point cloud can be transmitted, for example in the form of a bitstream, to the other terminal device (120) via the network (150). The terminal device (120) may receive the compressed point cloud from the network (150), decompress the bitstream to reconstruct the point cloud and suitably display the reconstructed point cloud. Unidirectional data transmission may be common in media serving applications and the like.

In the FIG. 1 example, the terminal devices (110) and (120) may be illustrated as servers, and personal computers, but the principles of the present disclosure may be not so limited. Embodiments of the present disclosure find application with laptop computers, tablet computers, smart phones, gaming terminals, media players and/or dedicated three-dimensional (3D) equipment. The network (150) represents any number of networks that transmit compressed point cloud between the terminal devices (110) and (120). The network (150) can include for example wireline (wired) and/or wireless communication networks. The network (150) may exchange data in circuit-switched and/or packet-switched channels. Representative networks include telecommunications networks, local area networks, wide area networks and/or the Internet. For the purposes of the present discussion, the architecture and topology of the network (150) may be immaterial to the operation of the present disclosure unless explained herein below.

Figure 2:
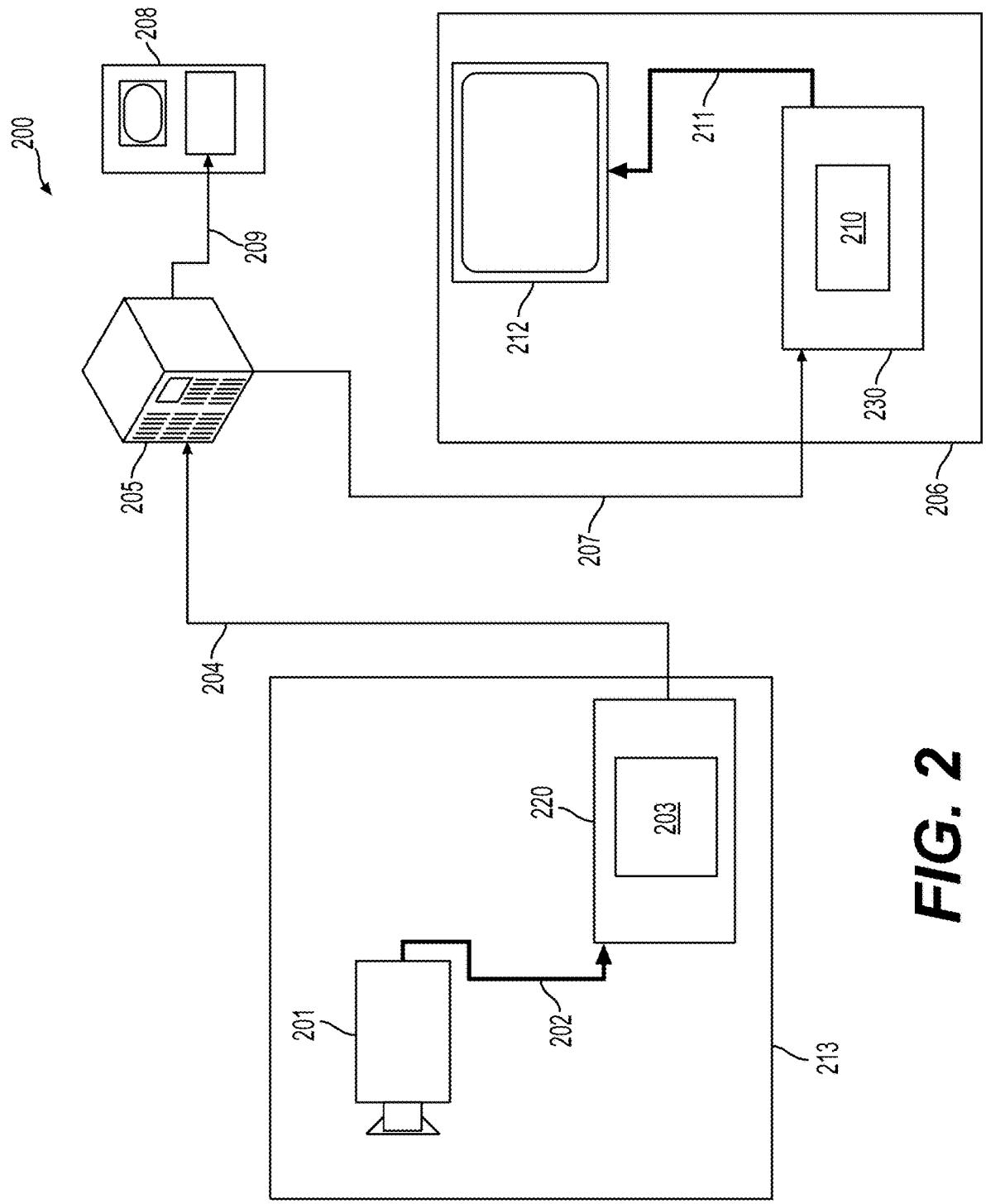
FIG. 2 shows a schematic illustration of a simplified block diagram of a streaming system (200) according to an embodiment of the disclosure.

FIG. 2 illustrates, as an example for an application for the disclosed subject matter for point cloud. The disclosed subject matter can be equally applicable to other point cloud enabled applications, including, 3D telepresence application, virtual reality application.

A streaming system (200) may include a capture subsystem (213). The capture subsystem (213) can include a point cloud source (201), for example light detection and ranging (LIDAR) systems, 3D cameras, 3D scanners, a graphics generation component that generates the uncompressed point cloud in software, and the like that generates for example point clouds (202) that are uncompressed. In an example, the point clouds (202) include points that are captured by the 3D cameras. The point clouds (202), depicted as a bold line to emphasize a high data volume when compared to compressed point clouds (204) (a bitstream of compressed point clouds). The compressed point clouds (204) can be generated by an electronic device (220) that includes an encoder (203) coupled to the point cloud source (201). The encoder (203) can include hardware, software, or a combination thereof to enable or implement aspects of the disclosed subject matter as described in more detail below. The compressed point clouds (204) (or bitstream of compressed point clouds (204)), depicted as a thin line to emphasize the lower data volume when compared to the stream of point clouds (202), can be stored on a streaming server (205) for future use. One or more streaming client subsystems, such as client subsystems (206) and (208) in FIG. 2 can access the streaming server (205) to retrieve copies (207) and (209) of the compressed point cloud (204). A client subsystem (206) can include a decoder (210), for example, in an electronic device (230). The decoder (210) decodes the incoming copy (207) of the compressed point clouds and creates an outgoing stream of reconstructed point clouds (211) that can be rendered on a rendering device (212). In some streaming systems, the compressed point clouds (204), (207), and (209) (e.g., bitstreams of compressed point clouds) can be compressed according to certain standards. In some examples, video coding standards are used in the compression of point clouds. Examples of those standards include, High Efficiency Video Coding (HEVC), Versatile Video Coding (VVC), and the like.

It is noted that the electronic devices (220) and (230) can include other components (not shown). For example, the electronic device (220) can include a decoder (not shown) and the electronic device (230) can include an encoder (not shown) as well.

Figure 3:
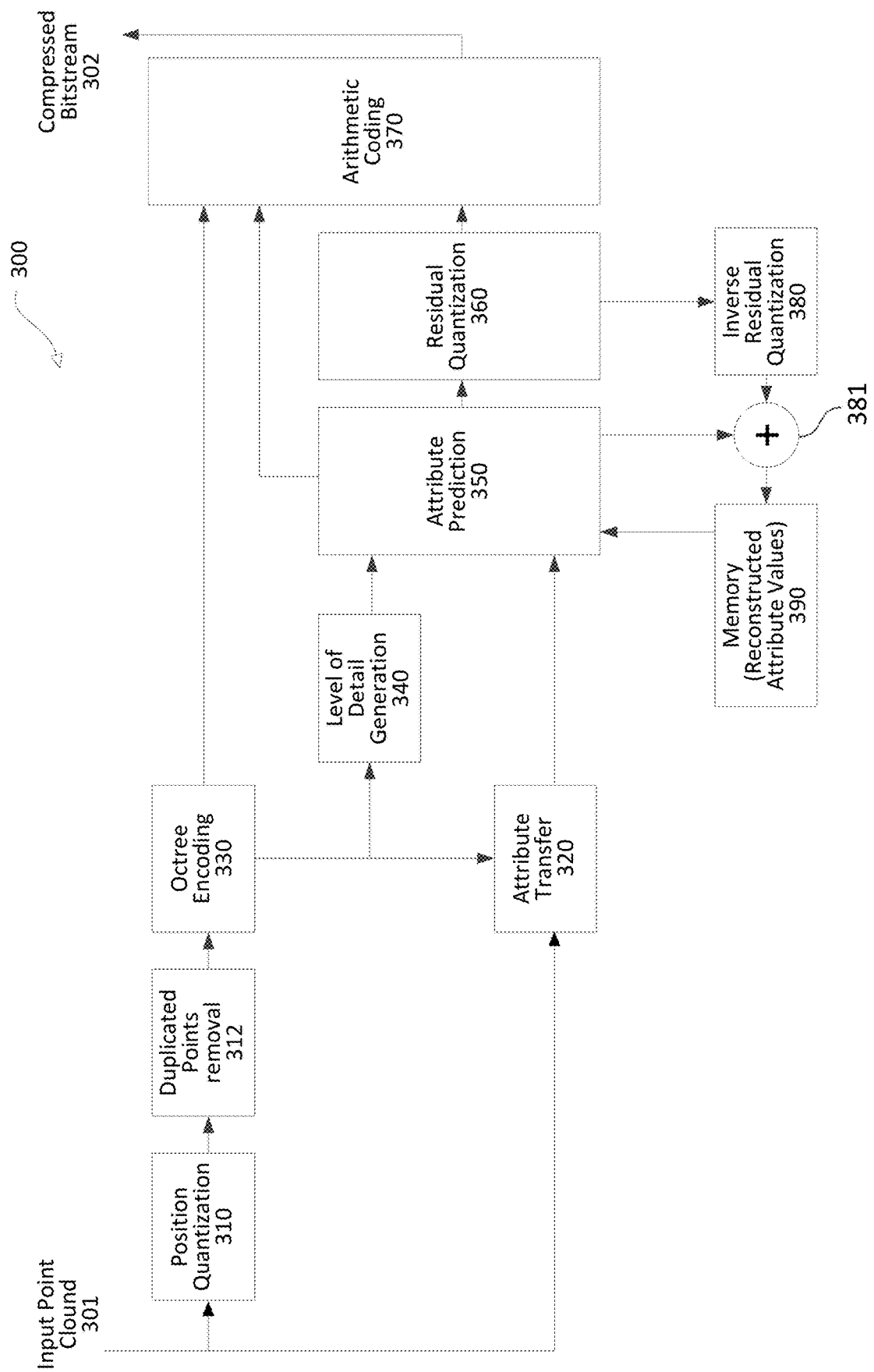
FIG. 3 shows an exemplary encoder according to an embodiment of the disclosure.

FIG. 3 shows an exemplary encoder (300) in accordance with an embodiment. The encoder can be configured to receive point cloud data and compress the point cloud data to generate a bit stream carrying compressed point cloud data. In an embodiment, the encoder (300) can include a position quantization module (310), a duplicated points removal module (312), an octree encoding module (330), an attribute transfer module (320), an LOD generation module (340), an attribute prediction module (350), a residual quantization module (360), an arithmetic coding module (370), an inverse residual quantization module (380), an addition module (381), and a memory (390) to store reconstructed attribute values.

As shown, an input point cloud (301) can be received at the encoder (300). Positions (3D coordinates) of the point cloud (301) are provided to the quantization module (310). The quantization module (310) is configured to quantize the coordinates to generate quantized positions. The optional duplicated points removal module (312) is configured to receive the quantized positions and perform a filter process to identify and remove duplicated points. The octree encoding module (330) is configured to receive filtered positions from the duplicated points removal module, and perform an octree-based encoding process to generate a sequence of occupancy codes that describe a 3D grid of voxels. The occupancy codes are provided to the arithmetic coding module (370).

The attribute transfer module (320) is configured to receive attributes of the input point cloud, and perform an attribute transfer process to determine an attribute value for each voxel when multiple attribute values are associated with the respective voxel. The attribute transfer process can be performed on the re-ordered points output from the octree encoding module (330). The attributes after the transfer operations are provided to the attribute prediction module (350). The LOD generation module (340) is configured to operate on the re-ordered points output from the octree encoding module (330), and re-organize the points into different LODs. LOD information is supplied to the attribute prediction module (350).

The attribute prediction module (350) processes the points according to an LOD-based order indicated by the LOD information from the LOD generation module (340). The attribute prediction module (350) generates an attribute prediction for a current point based on reconstructed attributes of a set of neighboring points of the current point stored in the memory (390). Prediction residuals can subsequently be obtained based on original attribute values received from the attribute transfer module (320) and locally generated attribute predictions. When candidate indices are used in the respective attribute prediction process, an index corresponding to a selected prediction candidate may be provided to the arithmetic coding module (370).

The residual quantization module (360) is configured to receive the prediction residuals from the attribute prediction module (350), and perform quantization to generate quantized residuals. The quantized residuals are provided to the arithmetic coding module (370).

The inverse residual quantization module (380) is configured to receive the quantized residuals from the residual quantization module (360), and generate reconstructed prediction residuals by performing an inverse of the quantization operations performed at the residual quantization module (360). The addition module (381) is configured to receive the reconstructed prediction residuals from the inverse residual quantization module (380), and the respective attribute predictions from the attribute prediction module (350). By combining the reconstructed prediction residuals and the attribute predictions, the reconstructed attribute values are generated and stored to the memory (390).

The arithmetic coding module (370) is configured to receive the occupancy codes, the candidate indices (if used), the quantized residuals (if generated), and other information, and perform entropy encoding to further compress the received values or information. As a result, a compressed bitstream (302) carrying the compressed information can be generated. The bitstream (302) may be transmitted, or otherwise provided, to a decoder that decodes the compressed bitstream, or may be stored in a storage device.

Figure 4:
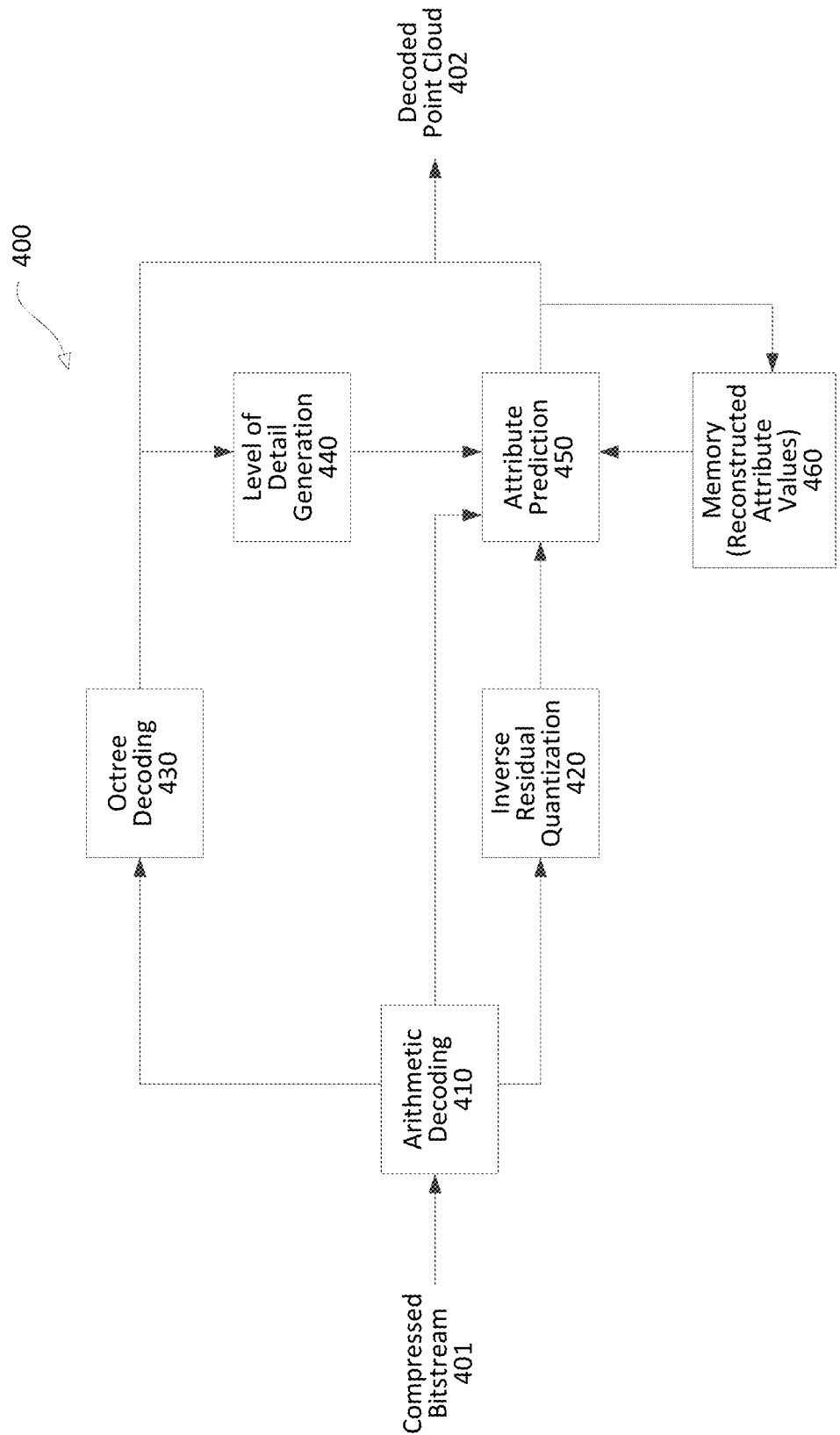
FIG. 4 shows an exemplary decoder according to an embodiment of the disclosure.

FIG. 4 shows an exemplary decoder (400) in accordance with an embodiment. The decoder (400) can be configured to receive a compressed bitstream and perform point cloud data decompression to decompress the bitstream to generate decoded point cloud data. In an embodiment, the decoder (400) can include an arithmetic decoding module (410), an inverse residual quantization module (420), an octree decoding module (430), an LOD generation module (440), an attribute prediction module (450), and a memory (460) to store reconstructed attribute values.

As shown, a compressed bitstream (401) can be received at the arithmetic decoding module (410). The arithmetic decoding module (410) is configured to decode the compressed bitstream (401) to obtain quantized residuals (if generated) and occupancy codes of a point cloud. The octree decoding module (430) is configured to determine reconstructed positions of points in the point cloud according to the occupancy codes. The LOD generation module (440) is configured to re-organize the points into different LODs based on the reconstructed positions, and determine an LOD-based order. The inverse residual quantization module (420) is configured to generate reconstructed residuals based on the quantized residuals received from the arithmetic decoding module (410).

The attribute prediction module (450) is configured to perform an attribute prediction process to determine attribute predictions for the points according to the LOD-based order. For example, an attribute prediction of a current point can be determined based on reconstructed attribute values of neighboring points of the current point stored in the memory (460). The attribute prediction module (450) can combine the attribute prediction with a respective reconstructed residual to generate a reconstructed attribute for the current point.

A sequence of reconstructed attributes generated from the attribute prediction module (450) together with the reconstructed positions generated from the octree decoding module (430) corresponds to a decoded point cloud (402) that is output from the decoder (400) in one example. In addition, the reconstructed attributes are also stored into the memory (460) and can be subsequently used for deriving attribute predictions for subsequent points.

In various embodiments, the encoder (300) and decoder (400) can be implemented with hardware, software, or combination thereof. For example, the encoder (300) and decoder (400) can be implemented with processing circuitry such as one or more integrated circuits (ICs) that operate with or without software, such as an application specific integrated circuit (ASIC), field programmable gate array (FPGA), and the like. In another example, the encoder (300) and decoder (400) can be implemented as software or firmware including instructions stored in a non-volatile (or non-transitory) computer-readable storage medium. The instructions, when executed by processing circuitry, such as one or more processors, causing the processing circuitry to perform functions of the encoder (300) and decoder (400).

It is noted that the attribute prediction modules (350) or (450) configured to implement the attribute prediction techniques disclosed herein can be included in other decoders or encoders that may have similar or different structures from what is shown in FIG. 3 and FIG. 4. In addition, the encoder (300) and decoder (400) can be included in a same device, or separate devices in various examples.

II. Geometry Quantization and Partition in Point Cloud Coding

1. Point Cloud Data

Point cloud has been widely used in recent years. For example, point cloud data is used in autonomous driving vehicles for object detection and localization. Point cloud data can also be used in geographic information systems (GIS) for mapping, and used in cultural heritage to visualize and archive cultural heritage objects and collections, etc.

A point cloud contains a set of high dimensional points, typically three dimensional (3D), each including 3D position information and additional attributes such as color, reflectance, etc. They can be captured using multiple cameras and depth sensors, or Lidar in various setups, and may be made up of thousands to billions of points to realistically represent the original scenes.

Therefore, compression technologies are needed to reduce the amount of data required to represent a point cloud for faster transmission or reduction of storage.

2. Geometry Coding by Octree Partition

The geometry information and the associated attributes such as color or reflectance can be separately compressed (e.g., in the Test Model 13 (TMC13) model). The geometry information, which includes the 3D coordinates of the point cloud, can be coded by an octree-partition with its occupancy information. The attributes can be compressed based on a reconstructed geometry using, for example, prediction and lifting techniques.

Figure 5:
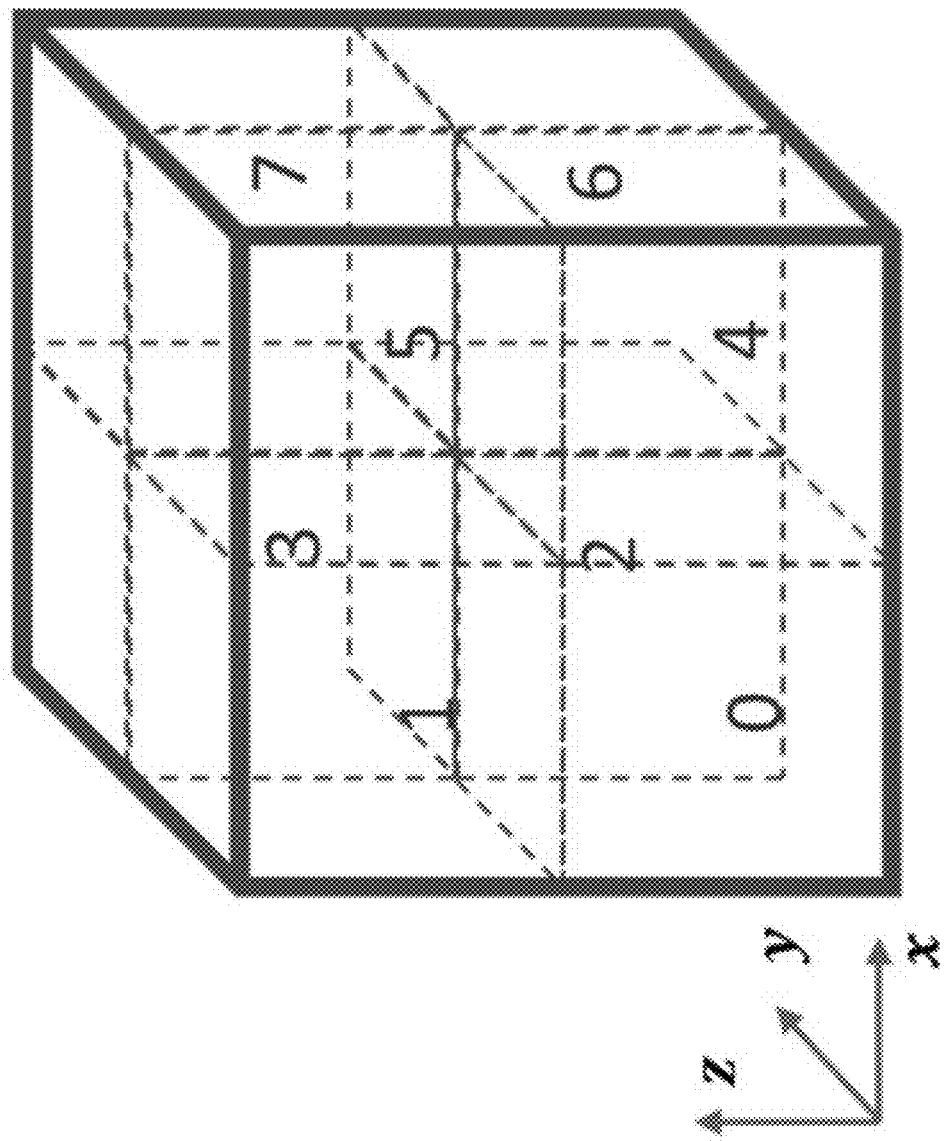
FIG. 5 shows an exemplary octree partition in a 3D cube according to an embodiment of the disclosure.

Input of the octree partition is a collection of transformed positions, i.e., $P_i$, i=1, 2, ..., N. FIG. 5 shows an exemplary octree partition in a 3D cube according to an embodiment of the disclosure. The 3D cube in solid lines is partitioned into eight smaller equal-sized cubes in dashed lines. The octree partition (e.g., in TMC13) is recursively performed to divide the original 3D space into the smallest units, and the occupancy information of every sub-space is encoded by an entropy coder to efficiently represent geometry positions.

The octree coding can be lossless. That is, all the input positions are encoded without any further quantization. For example, in TMC13, if an octree geometry codec is used, a geometry encoding proceeds as follows.

First, a cubical axis-aligned bounding box is defined by two points (0,0,0) and $(2^d, 2^d, 2^d)$, where $2^d$ defines a size of the bounding box and d is encoded to a bitstream. It assumes that all the points $P_i$ are inside the bounding box.

Then, an octree partition structure is built by recursively subdividing the bounding box. At each stage, a cube of the bounding box is subdivided into 8 sub-cubes. An 8-bit code, referred to as an occupancy code, is then generated by associating a 1-bit value with each sub-cube in order to indicate whether a respective sub-cube contains points (e.g., for a full sub-cube, the corresponding bit has value 1) or not (e.g., for an empty sub-cube, the corresponding bit has value 0). Only full sub-cubes with a size greater than a value, for example 1 (i.e., non-voxels), are further subdivided. The occupancy code for each cube of the bounding box is then compressed by an arithmetic encoder. Each cube of the bounding box corresponds to a node of the octree partition structure. Therefore, the occupancy code of each cube corresponds to the node of the respective cube.

3. Encoding of Occupancy Code

An occupancy code of a current node of the octree partition structure can be compressed by an arithmetic encoder. The occupancy code can be denoted as S which is an 8-bit integer, and each bit in S indicates an occupancy status of each child node of the current node. Two exemplary encoding methods (e.g., in TMC13) for the occupancy code are bit-wise encoding and byte-wise encoding. In TMC13, the bit-wise encoding is enabled by default. Either method performs arithmetic coding with context modeling to encode the occupancy code, where the context status is initialized at the beginning of the whole coding process and is updated during the coding process.

For bit-wise encoding, eight bins in S are encoded in a certain order where each bin is encoded by referring to the occupancy status of neighboring nodes and child nodes of the neighboring nodes, where the neighboring nodes are at the same level of the current node.

For byte-wise encoding, S is encoded by referring to: (1) an adaptive look up table (A-LUT), which keeps track of the N (e.g., 32) most frequent occupancy codes; and (2) a cache which keeps track of the last different observed M (e.g., 16) occupancy codes.

A binary flag indicating whether S is in the A-LUT or not is encoded. If S is in the A-LUT, the index in the A-LUT is encoded by using a binary arithmetic encoder. If S is not in the A-LUT, then a binary flag indicating whether S is in the cache or not is encoded. If S is in the cache, then the binary representation of its index in the cache is encoded by using a binary arithmetic encoder. Otherwise, if S is not in the cache, then the binary representation of S is encoded by using a binary arithmetic encoder.

Figure 6:
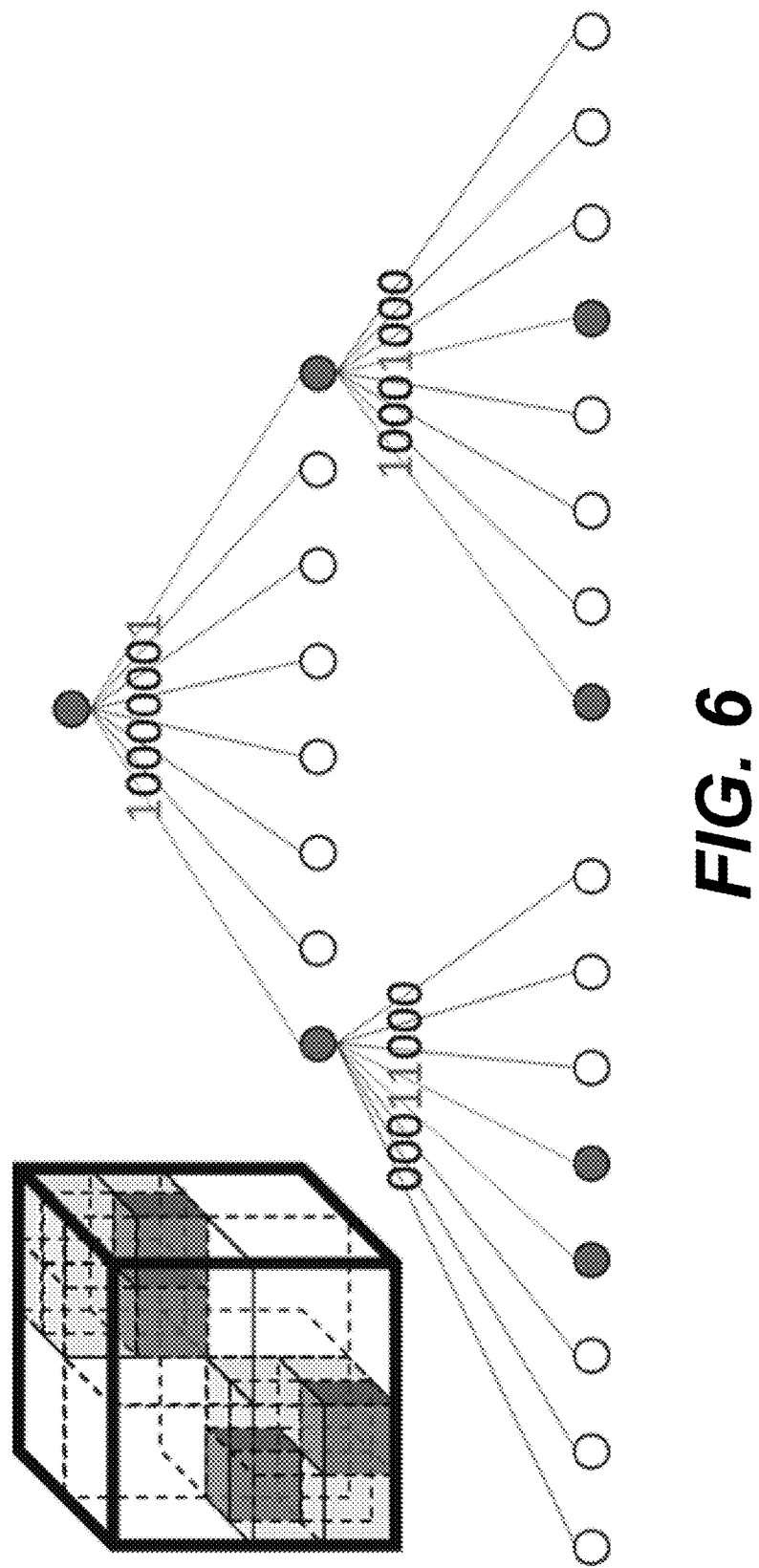
FIG. 6 shows an example of a two-level octree partition and the corresponding occupancy code according to an embodiment of the disclosure.

A decoding process can start by parsing the dimensions of the bounding box from the bitstream. The same octree structure is then built by subdividing the bounding box according to the decoded occupancy codes. An example of two-level octree partition and the corresponding occupancy codes are shown in FIG. 6, where cubes and nodes in dark indicate that they are occupied by points.

Figure 7:
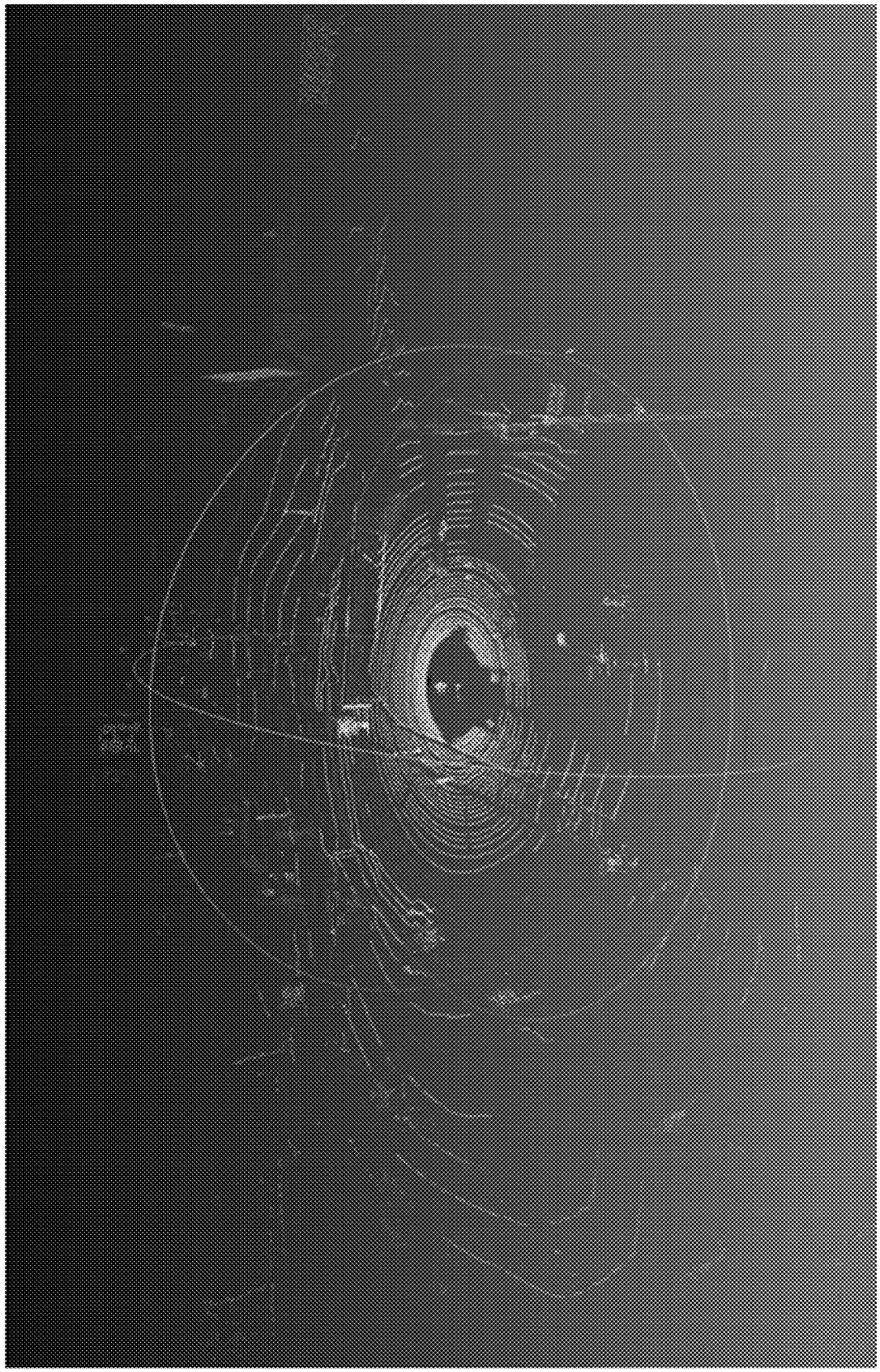
FIG. 7 shows an exemplary point cloud generated by a Lidar system according to an embodiment of the disclosure.

FIG. 7 shows an exemplary point cloud generated by a Lidar system. In the point cloud, point densities vary across the space, where points near a position of the Lidar sensor (e.g., an origin in world coordinates) tend to be denser than those farther away from the origin. These points with a smaller distance from the origin may also have a higher accuracy, implying a higher priority in compression. An overall coding performance can be improved by adaptive encoder optimizations to allocate more bits on important points. However, the geometry quantization scheme employed in some cases, such as TMC13, prevents adaptive bit allocation for geometry because of a constant quantization parameter (QP).

4. Geometry Quantization in TMC13

In some related cases (e.g., TMC13), a point cloud is a collection of points in 3D, each with a position $P_i^o = (x_i, y_i, z_i)^T$, i=1, 2, ..., N, where N is a total number of points in the point cloud. Original application-specific point positions are generally represented by floating-point numbers and may have any kind of structures.

Geometry quantization (e.g., in TMC13) can be performed as a pre-processing stage before any compression, as shown in FIG. 8A. That is, the QP of the geometry quantization is a fixed constant for all positions. Specifically, a position $P_i^o$ is transformed as follows, $$P_i = \text{Round}\left(\frac{P_i^o - S}{Q}\right) \quad (1)$$

where $S = (s_x, s_y, s_z)^T$ is a shifting vector used to move the origin of $P_i^o$ to zeros. Q is a scalar parameter for geometry quantization, Round(•) is a rounding operator to make the transformed positions $P_i$ be a non-negative integer. Q can be signaled to a decoder for reconstruction of the point cloud.

The reconstruction of geometry is an inverse process of (1) as follows, $$\hat{P}_i = P_i * Q + S \quad (2)$$

where $\hat{P}_i$ indicates a reconstructed position. Q and S are the same as those in (1) and signaled in the bitstream header.

The fixed quantization scheme disables useful coding functionalities in some applications including rate control and other optimizations. In traditional 2D video coding sceneries, these functionalities have been acknowledged to be critical in applications.

III. Proposed Adaptive Quantization for Point Cloud Coding

According to aspects of the disclosure, a new quantization scheme is introduced into the octree coding procedure in PCC, which enables adaptive geometry quantization. As shown in FIG. 8B, this new quantization involves QP variation in octree coding, where QPs may vary for different nodes of the octree partition structure. Each node corresponds to a cube (or part) of a bounding box of a point cloud. The octree partition and the corresponding occupancy coding can be adjusted accordingly. Methods of signaling QP variation are elaborated as well. This disclosure enables a new functionality of adaptive bit allocation across the space for geometry coding, therefore rate control and other lower-level optimizations become more feasible. It is noted that this disclosure is not limited to the TMC13 software or MPEG-PCC standard, it is a general solution for various PCC systems.

In this disclosure, the adaptive quantization is introduced into the octree partition stage, thus the octree coding can be lossy because of the extra quantization. The quantization in the pre-processing stage remains unchanged, and the goal of the pre-processing quantization is voxelization making all positions integers such that the octree partition can be performed. It is noted that these two quantization processes are independent from each other. One exemplary implementation of the octree partition with the adaptive quantization is further described below. However, it is noted that any other forms of implementation that enables adaptive geometry quantization for PCC are included in the disclosure. For example, if QPs are restricted to be as a power of two, the following implementation could be simplified.

The exemplary adaptive quantization is applied while performing octree partitioning. At each node of the octree partition, all the points inside a corresponding sub-cube can be quantized based on a specified QP, which can vary for different nodes. More specifically, let $P_i^{l,k} = (x_i^{l,k}, y_i^{l,k}, z_i^{l,k})^T$ be the position of the $i^{th}$ (i=1, 2, ..., $N^{l,k}$) point of a current sub-cube corresponding to a current sub-node (specified by l and k), where l (l=0, 1, ..., d) is the octree partition depth of the current sub-node and k (k=1, 2, ..., $2^l$) is the index of the current sub-node in depth l, and $N^{l,k}$ is the total number of points inside the current sub-cube corresponding to the current sub-node. A bounding box of the current sub-cube can be defined by a start point $P_s^{l,k} = (x_s^{l,k}, y_s^{l,k}, z_s^{l,k})^T$ and an end point $P_e^{l,k} = (x_e^{l,k}, y_e^{l,k}, z_e^{l,k})^T$. All the points are supposed to be inside the bounding box, i.e., $x_s^{l,k} \leq x_i^{l,k} < x_e^{l,k}$, $y_s^{l,k} \leq y_i^{l,k} < y_e^{l,k}$ and $z_s^{l,k} \leq z_i^{l,k} < z_e^{l,k}$ for all i=1, 2, ..., $N^{l,k}$.

Let $Q^{l,k}$ be the corresponding QP for the current sub-cube.

First, the exemplary adaptive quantization is applied to the start and end points of the bounding box of the current sub-cube as follows, $$\widehat{P_s}^{l,k} = \left\lceil \frac{P_s^{l,k}}{Q^{l,k}} \right\rceil \quad (3)$$

$$\widehat{P_e}^{l,k} = \left\lfloor \frac{P_e^{l,k} - 1}{Q^{l,k}} \right\rfloor \quad (4)$$

where $\lceil \cdot \rceil$ and $\lfloor \cdot \rfloor$ indicate the ceiling and flooring operations, respectively. $\widehat{P_s}^{l,k} = (\hat{x}_s^{l,k}, \hat{y}_s^{l,k}, \hat{z}_s^{l,k})^T$ and $\widehat{P_e}^{l,k} = (\hat{x}_e^{l,k}, \hat{y}_e^{l,k}, \hat{z}_e^{l,k})^T$ are the start and end positions after the exemplary adaptive quantization, and they define the bounding box of the quantized sub-cube. In addition, they can decide the octree partition of the current sub-cube.

Second, the exemplary adaptive quantization can be applied to all the points inside the current sub-cube as follows, $$\hat{P}_i^{l,k} = \text{Clip}\left\{\text{Round}\left(\frac{P_i^{l,k}}{Q^{l,k}}\right), \widehat{P_s}^{l,k}, \widehat{P_e}^{l,k}\right\} \quad (5)$$

where $$\text{Clip}\{p, \min, \max\} = \begin{cases} \min & \text{if } p < \min \\ \max & \text{if } p > \max \\ p & \text{otherwise} \end{cases}$$

is a piece-wise linear function applied to each component of the position $P_i^{l,k}$ to make sure that the quantized position $\hat{P}_i^{l,k} = (\hat{x}_i^{l,k}, \hat{y}_i^{l,k}, \hat{z}_i^{l,k})^T$ is in the bounding box of the quantized sub-cube, i.e. $\hat{x}_s^{l,k} \leq \hat{x}_i^{l,k} \leq \hat{x}_e^{l,k}$, $\hat{y}_s^{l,k} \leq \hat{y}_i^{l,k} \leq \hat{y}_e^{l,k}$, $\hat{z}_s^{l,k} \leq \hat{z}_i^{l,k} \leq \hat{z}_e^{l,k}$ Then the octree partition of the current sub-cube can be determined on the quantized start and end positions.

First, if $\widehat{P_s}^{l,k} \geq \widehat{P_e}^{l,k}$, it indicates that $Q^{l,k}$ is large enough to quantize all points in the current sub-cube to a single point, in which case no further partition is needed. Otherwise, the octree partition can be performed based on the partition point in the quantized sub-cube, which is, for example, in the middle of $\widehat{P_s}^{l,k}$ and $\widehat{P_e}^{l,k}$, i.e., $$\widehat{P_m}^{l,k} = \left\lceil \frac{\widehat{P_s}^{l,k} + \widehat{P_e}^{l,k}}{2} \right\rceil.$$

For example, if a point after the exemplary adaptive quantization has all its dimensions smaller than that of the partition point $\widehat{P_m}^{l,k}$, it can be divided into the first child sub-cube (or node). If a point after the exemplary adaptive quantization has all dimensions larger than or equal to $\widehat{P_m}^{l,k}$, it can be divided into the last child sub-cube (or node). Meanwhile, the partition point in the original sub-cube can be calculated as follows, $$P_m^{l,k} = \left\lceil \frac{2\widehat{P_m}^{l,k} - 1}{2} * Q^{l,k} \right\rceil \quad (6)$$

By performing octree partition from current sub-cube (or node), the start and end points of eight child sub-cubes (or nodes) in a next partition depth can be as follows, $$P_s^{l+1,8k+j} = \begin{bmatrix} z(j\,\&4) & 0 & 0 \\ 0 & z(j\,\&2) & 0 \\ 0 & 0 & z(j\,\&1) \end{bmatrix} \quad (7)$$

$$P_m^{l,k} + \begin{bmatrix} z(j\wedge4) & 0 & 0 \\ 0 & z(j\wedge2) & 0 \\ 0 & 0 & z(j\wedge1) \end{bmatrix} P_s^{l,k}$$

$$P_s^{l+1,8k+j} = \begin{bmatrix} z(j\,\&4) & 0 & 0 \\ 0 & z(j\,\&2) & 0 \\ 0 & 0 & z(j\,\&1) \end{bmatrix} \quad (8)$$

$$P_e^{l,k} + \begin{bmatrix} z(j\wedge4) & 0 & 0 \\ 0 & z(j\wedge2) & 0 \\ 0 & 0 & z(j\wedge1) \end{bmatrix} P_m^{l,k}$$

where $j=0, 1, \ldots, 7$ is the index of eight child nodes in the order as shown in FIG. 5. The operators "&" and "^" are bit "and" and bit "xor" operators, respectively. $z(x)$ equals 1 if x is non-zero and equals 0 otherwise.

Figure 9A:
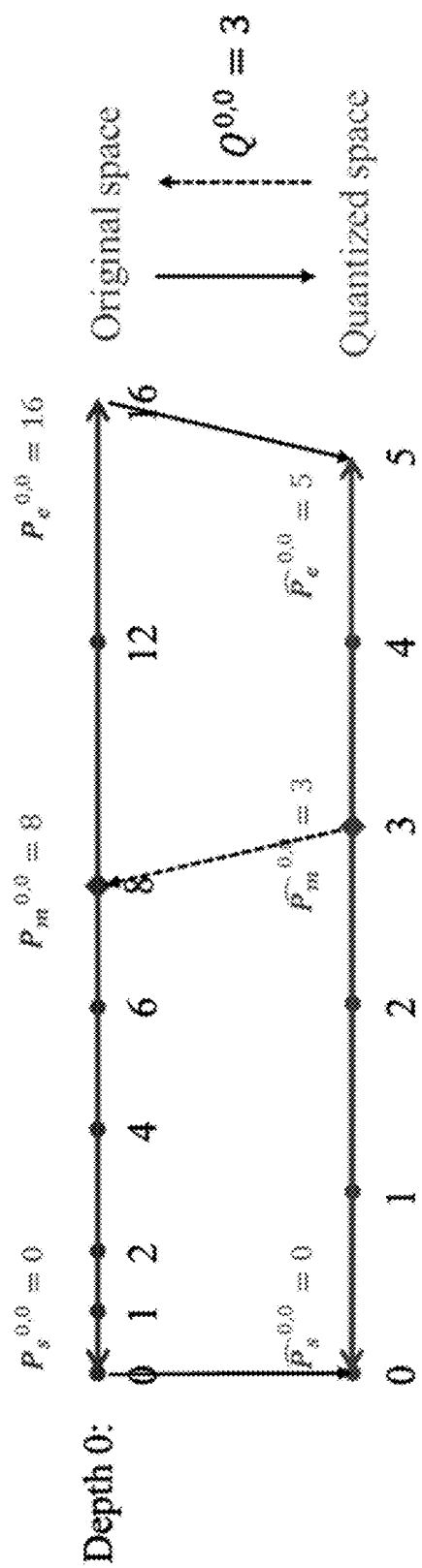
FIGS. 9A and 9B show a simplified quantization and partition in 1D according to an embodiment of the disclosure.
Figure 9B:
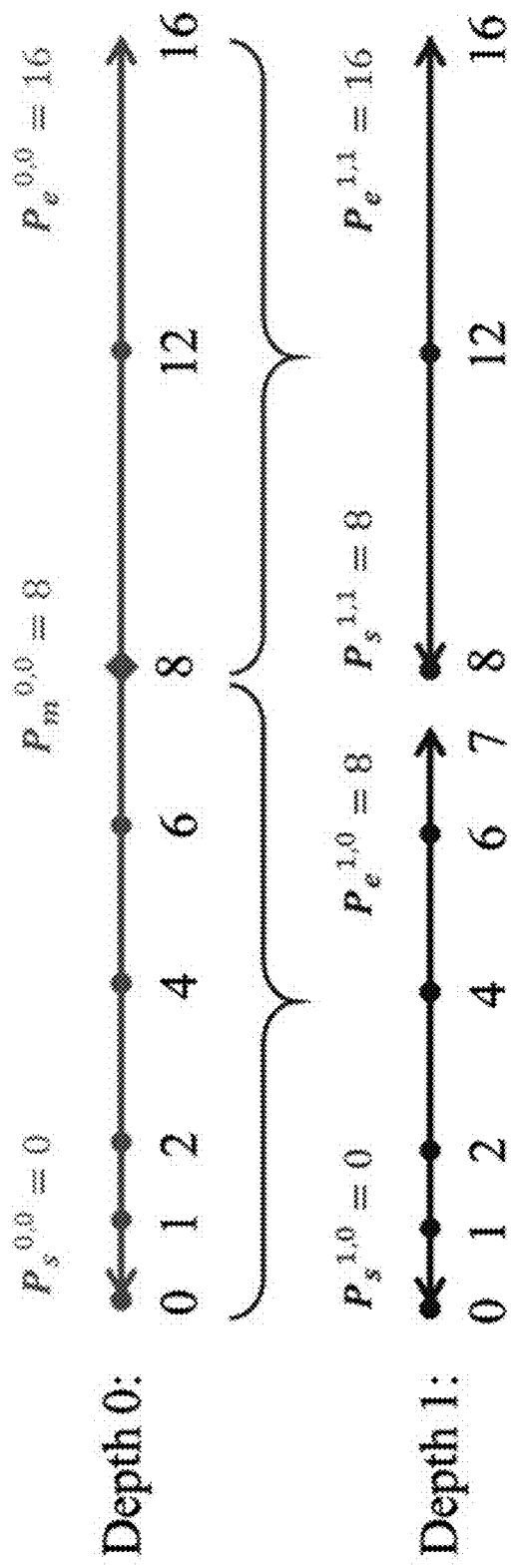

FIGS. 9A and 9B show a simplified quantization and partition in 1D according to an embodiment of the disclosure. The simplified partition starts from depth 0, in which the start and end positions in the original space are $P_s^{0,0}=0$ and $P_e^{0,0}=16$. The QP for the original space (or node) is $Q^{0,0}=3$. The middle points, i.e., the partition point, in original and quantized spaces can be calculated based on Eqs. (3)-(6). As shown in FIG. 9A, the middle point in original space is $P_m^{0,0}=8$. Then based on the middle point, the points in the original space are divided into two groups of sub-points (or sub-nodes) reaching the next depth with new start and end positions as shown in FIG. 9B. Based on Eqs. (7)-(8), the first sub-node has a start position $P_s^{1,0}=0$ and an end position $P_s^{1,0}=8$, and the second sub-node has a start position $P_s^{1,1}=8$ and the end position $P_s^{1,1}=16$.

It is noted that the proposed adaptive quantization inside the octree partition is independent from the quantization in the pre-processing stage. If $Q^{l,k}=1$ for all l and k, the octree coding can be lossless and is the same as TMC13. The proposed adaptive quantization can be achieved by changing $Q^{l,k}$ for different sub-nodes. In the next section, methods of signaling QP variation are described in further detail.

IV. Signaling of QP Variations for Adaptive Geometry Quantization

1. Signaling Control Flags

A first high level syntax element can be added to indicate whether the signaling of one or more QP variations (delta QPs) is enabled. If so, a second high level syntax element can be added to indicate an octree partition depth where the signaling of the one or more delta QPs is allowed.

For instance, a one-bit flag can be signaled in a sequence header and/or in a slice header to enable or disable the signaling of delta QP. If the flag is 0, no further signaling is allowed and the constant QP can be applied to the octree partition; otherwise, delta QP can be signaled.

Besides, a nonnegative integer can be signaled if the signaling of delta QP is enabled, to indicate one or more depths of the octree partition at which the signaling of delta QP is allowed.

In addition, a base QP can be signaled either in the sequence header or other levels such as in the slice header. The base QP applies to all sub-nodes where the delta QP is not specified. If the signaling of delta QP is disabled, the base QP can be applied to all sub-nodes of the octree partition. In some embodiments, the base QP is a predictor of delta QP.

In an embodiment, one flag is signaled in a sequence header to indicate whether the signaling of delta QP is enabled. If so, a depth is further signaled to specify a certain depth of the octree partition at which the signaling of delta QP is allowed. An exemplary syntax table is shown in Table 1.

TABLE 1

| | Descriptor |
|---|---|
| seq_parameter_set( ) { | |
|   profile_compatibility_flags | u(24) |
|   level_idc | u(8) |
|   sps_bounding_box_present_flag | u(1) |
|   if( sps_bounding_box_present_flag ) { | |
|     sps_bounding_box_offset_x | se(v) |
|     sps_bounding_box_offset_y | se(v) |
|     sps_bounding_box_offset_z | se(v) |
|     sps_bounding_box_scale_factor | ue(v) |
|     sps_bounding_box_size_width | ue(v) |
|     sps_bounding_box_size_height | ue(v) |
|     sps_bounding_box_size_depth | ue(v) |
|   } | |
|   sps_source_scale_factor | u(32) |
|   sps_geo_qp_base | ue(v) |
|   sps_geo_delta_qp_flag | u(1) |
|   if( sps_geo_delta_qp _flag ) { | |
|     sps_geo_delta_qp_signal_depth | ue(v) |
|   } | |
|   sps_seq_parameter_set_id | ue(v) |
|   sps_num_attribute_sets | ue(v) |
|   for( i = 0; i < sps_num_attribute_sets; i++ ) { | |
|     attribute_dimension[ i ] | ue(v) |
|     attribute_instance_id[ i ] | ue(v) |
|     attribute_bitdepth[ i ] | ue(v) |
|     attribute_cicp_colour_primaries[ i] | ue(v) |
|     attribute_cicp_transfer_characteristics[ i ] | ue(v) |
|     attribute_cicp_matrix_coeffs[ i ] | ue(v) |
|     attribute_cicp_video_full_range_flag[ i ] | u(1) |
|     known_attribute_label_flag[ i ] | u(1) |
|     if( known_attribute_label_flag[ i ] ) | |
|       known_attribute_label[ i ] | ue(v) |
|     else | |
|       attribute_label_four_bytes[ i ] | u(32) |
|   } | |
|   sps_extension_present_flag | u(1) |
|   if( sps_extension_present_flag ) | |
|     while(more_data_in_byte_stream( ) ) | |
|       sps_extension_data_flag | u(1) |
|   byte_alignment( ) | |
| } | |

The variable sps_geo_qp_base specifies the base QP that can be used in the octree partition as qpBase= sps_geo_qp_base. qpBase can then be used as the default QP in the octree partition when the delta QP is not applied. It can be also used as the predictor of delta QP.

If the variable sps_geo_delta_qp_flag equals 1, it specifies the signaling of delta QP is enabled for the sequence of bitstream. If the variable sps_geo_delta_qp_flag equals 0, it specifies the signaling of delta QP is disabled for the sequence of bitstream. If the signaling of delta QP is enabled, the variable sps_geo_delta_qp_signal_depth specifies the depth of the octree partition at which the delta QP is signaled. When an octree partition depth is below the specified variable sps_geo_delta_qp_signal_depth, qpBase is used as the default QP in the octree partition.

In an embodiment, the base QP is limited to a number that is a power of two. An exemplary syntax table is shown in Table 2.

TABLE 2

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base_log2 | ue(v) |
|   sps_geo_delta_qp_flag | u(1) |
|   if( sps_geo_delta_qp_flag ) { | |
|     sps_geo_delta_qp_signal_depth | ue(v) |
|   } | |
|   sps_seq_parameter_set_id | ue(v) |
|   ... | ... |
|   byte_alignment( ) | |
| } | |

The variable sps_geo_qp_base_log2 specifies the base QP that can be used in the octree partition as qpBase=$2^{sps\_geo\_qp\_base\_log2}$. qpBase can then be used as the default QP in the octree partition when the delta QP is not applied. It can be also used as the predictor of delta QP.

In an embodiment, one flag is signaled in slice header to indicate whether the signaling of delta QP is enabled. If so, a depth is further signaled to specify a certain depth of octree partition at which the signaling of delta QP is allowed. An exemplary syntax table is shown in Table 3.

TABLE 3

| | Descriptor |
|---|---|
| geometry_slice_header( ) { | |
|   gsh_geometry_parameter_set_id | ue(v) |
|   gsh_tile_id | ue(v) |
|   gsh_slice_id | ue(v) |
|   if( gps_box_present_flag ) { | |
|     gsh_box_log2_scale | ue(v) |
|     gsh_box_origin_x | ue(v) |
|     gsh_box_origin_y | ue(v) |
|     gsh_box_origin_z | ue(v) |
|   } | |
|   gsh_log2_max_nodesize | ue(v) |
|   gsh_geo_delta_qp_flag | u(1) |
|   if( gsh_geo_delta_qp _flag ) { | |
|     gsh_geo_delta_qp_signal_depth | ue(v) |
|   } | |
|   gsh_num_points | ue(v) |
|   byte_alignment( ) | |
| } | |

If the variable gsh_geo_delta_qp_flag equals 1, it specifies the signaling of delta QP is enabled for the slice. If the variable gsh_geo_delta_qp_flag equals 0, it specifies the signaling of delta QP is disabled for the slice. If the signaling of delta QP is enabled, the variable gsh_geo_delta_qp_signal_depth specifies the depth of the octree partition at which the delta QP is signaled. When an octree partition depth is below the specified variable sps_geo_delta_qp_signal_depth, qpBase specified by the variable sps_geo_qp_bese is used as the default QP.

In an embodiment, the QP variation is only allowed at the slice level, indicating each slice is assigned by a fixed QP and no delta QP in the slice is allowed. An exemplary syntax table is shown in Table 4.

TABLE 4

| | Descriptor |
|---|---|
| geometry_slice_header( ) { | |
|   gsh_geometry_parameter_set_id | ue(v) |
|   gsh_tile_id | ue(v) |
|   sh_slice_id | ue(v) |
|   if( gps_box_present_flag ) { | |
|     gsh_box_log2_scale | ue(v) |
|     gsh_box_origin_x | ue(v) |
|     gsh_box_origin_y | ue(v) |
|     gsh_box_origin_z | ue(v) |
|   } | |
|   gsh_log2_max_nodesize | ue(v) |
|   if( sps_geo_delta_qp_flag ) { | |
|     gsh_geo_slice_qp | ue(v) |
|   } | |
|   gsh_num_points | ue(v) |
|   byte_alignment( ) | |
| } | |

If the variable sps_geo_delta_qp_flag equals 1, the variable gsh_geo_slice_qp specifies the QP that can be applied for the current slice, indicating QPs of all sub-nodes (or sub-cubes) in the slice are the same, i.e., $Q^{l,k}$= gsh_geo_slice_qp. If the variable sps_geo_delta_qp_flag equals 0, $Q^{l,k}$=qpBase.

In an embodiment, the QP variation is only allowed at the slice level, indicating each slice is assigned by a fixed QP and no delta QP in the slice is allowed. In this case, the slice QP is signaled as the delta QP to the base QP specified by the variable sps_geo_qp_base in sequence header. An exemplary syntax table is shown in Table 5.

TABLE 5

| | Descriptor |
|---|---|
| geometry_slice_header( ) { | |
|   gsh_geometry_parameter_set_id | ue(v) |
|   gsh_tile_id | ue(v) |
|   gsh_slice_id | ue(v) |
|   if( gps_box_present_flag ) { | |
|     gsh_box_log2_scale | ue(v) |
|     gsh_box_origin_x | ue(v) |
|     gsh_box_origin_y | ue(v) |
|     gsh_box_origin_z | ue(v) |
|   } | |
|   gsh_log2_max_nodesize | ue(v) |
|   if( sps_geo_delta_qp_flag ) { | |
|     gsh_geo_slice_delta_qp_from_base | ue(v) |
|   } | |
|   gsh_num_points | ue(v) |
|   byte_alignment( ) | |
| } | |

If the variable sps_geo_delta_qp_flag equals 1, the variable gsh_geo_slice_delta_qp_from_base specifies the QP that can be applied for the current slice as $Q^{l,k}$=qpBase+gsh_geo_slice_delta_qp_from_base, indicating QPs of all sub-nodes in the slice can be the same. If the variable sps_geo_delta_qp_flag equals 0, $Q^{l,k}$=qpBase.

In an embodiment, one flag is signaled in a sequence header to indicate whether the signaling of delta QP is enabled. If so, a depth is further signaled to specify the depth of the octree partition from which the signaling of delta QP is allowed. An exemplary syntax table is shown in Table 6.

TABLE 6

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp_flag ) { | |
|     sps_geo_delta_qp_signal_min_depth | ue(v) |
|   } | |
|   sps_seq_parameter_set_id | ue(v) |
|   ... | ... |
|   byte_alignment( ) | |
| } | |

If the variable sps_geo_delta_qp_flag equals 1, the variable sps_geo_delta_qp_signal_min_depth specifies a certain depth of the octree partition from which to all the depths above the delta QP is signaled. When the octree partition depth does not reach the variable sps_geo_delta_qp_signal_min_depth, qpBase specified by the variable sps_geo_qp_bese is used as default.

In an embodiment, one flag is signaled in slice header to indicate whether the signaling of delta QP is enabled. If so, a depth is further signaled to specify the depth of octree partition from which the signaling of delta QP is allowed. An exemplary syntax table is shown in Table 7.

TABLE 7

| | Descriptor |
|---|---|
| geometry_slice_header( ) { | |
|   gsh_geometry_parameter_set_id | ue(v) |
|   ... | ... |
|   gsh_log2_max_nodesize | ue(v) |
|   gsh_geo_delta_qp_flag | u(1) |
|   if( gsh_geo_delta_qp_flag) { | |
|     gsh_geo_delta_qp_signal_min_depth | ue(v) |
|   } | |
|   gsh_num_points | ue(v) |
|   byte_alignment( ) | |
| } | |

If the variable gsh_geo_delta_qp_flag equals 1, the variable gsh_geo_delta_qp_signal_min_depth specifies the depth of the octree partition from which the signaling of delta QP is allowed.

2. Signaling QP by Tables

Instead of signaling the delta QP values directly, the delta QP can be included in a look-up table and then referenced by an index of the table. This table can be either fixed or signaled in the bitstream. If the table is signaled in the bitstream, the elements of the table can be either signaled independently or signaled by their differences (i.e., difference between two elements of the table). The elements of the table can be either QP values or the delta QP values. In the following embodiments, the QP table is signaled in the sequence header of the bitstream. It is noted that the QP table can be also signaled in other levels such as the slice header.

In one embodiment, the look-up table specifying all the QP values (other than the base QP) that might be used in adaptive geometry quantization is signaled in Table 8.

TABLE 8

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp _flag) { | |
|     sps_geo_delta_qp_signal_depth | ue(v) |
|     sps_geo_qp_table_flag | u(1) |
|     If(sps_geo_qp_table_flag) { | |
|       sps_geo_qp_table_size_minus_one | ue(v) |
|       for(i=0; i < sps_geo_qp_table_size; i++) { | |
|         sps_geo_qp_table_element[ i ] | ue(v) |
|       } | |
|     } | |
|   } | |
|   sps_seq_parameter_set_id | ue(v) |
|   ... | ... |
|   byte_alignment( ) | |
| } | |

If the variable sps_geo_qp_table_flag equals 1, it specifies that the QPs can be represented (and signaled) by their indices in the QP table. If the variable sps_geo_qp_table_flag equals 0, it specifies that the QPs can be represented (and signaled) by their values directly. If the variable sps_geo_qp_table_flag equals 1, the variable sps_geo_qp_table_size_minus_one is then signaled to specify a size of the look-up table as sps_geo_qp_table_size=sps_geo_qp_table_size_minus_one+1.

Then, every element of the QP table is signaled by the variable sps_geo_qp_table_element[i]. The elements specify all the QPs that might be used in adaptive geometry quantization as $QT_i$=sps_geo_qp_table_element[i], where $QT_i$ indicates one element in the QP table. When the octree partition depth is below the specified the variable sps_geo_delta_qp_signal_depth, qpBase specified by the variable sps_geo_qp_bese is used as the default QP. Otherwise, QPs can be specified by indices referring to the QP table.

In an embodiment, the look-up table specifying all the delta QP values that might be used in adaptive geometry quantization is signaled in Table 9.

TABLE 9

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp _flag ) { | |
|     sps_geo_delta_qp_signal_depth | ue(v) |
|     sps_geo_delta_qp_table_flag | u(1) |
|     If(sps_geo_delta_qp_table_flag) { | |
|       sps_geo_delta_qp_table_size_minus_one | ue(v) |
|       for(i=0; i < sps_geo_qp_table_size; i++) { | |
|         sps_geo_delta_qp_table_element[ i ] | ue(v) |
|       } | |
|     } | |
|   } | |
|   sps_seq_parameter_set_id | ue(v) |
|   ... | ... |
|   byte_alignment( ) | |
| } | |

If the variable sps_geo_delta_qp_table_flag equals 1, it specifies that the QPs can be represented (and signaled) by indices in the delta QP table. If the variable sps_geo_delta_qp_table_flag equals 0, it specifies that the QPs can be represented (and signaled) by the values of the QPs directly. If the variable sps_geo_delta_qp_table_flag equals 1, the variable sps_geo_delta_qp_table_size_minus_one is signaled to specify a size of the look-up table as sps_geo_delta_qp_table_size=sps_geo_delta_qp_table_size_minus_one+1.

Then, every element of the delta QP table is signaled by the variable sps_geo_delta_qp_table_element[i]. They specify all the delta QPs that might be used in adaptive geometry quantization as $DQT_i$=sps_geo_delta_qp_table_element[i], where $DQT_i$ indicates one element in the delta QP table. When the octree partition depth is below the specified variable sps_geo_delta_qp_signal_depth, qpBase specified by the variable sps_geo_qp_bese is used as the default QP. Otherwise, QPs can be specified by indices referring to the delta QP table.

3. Signaling QP Based on Regions

Figure 10:
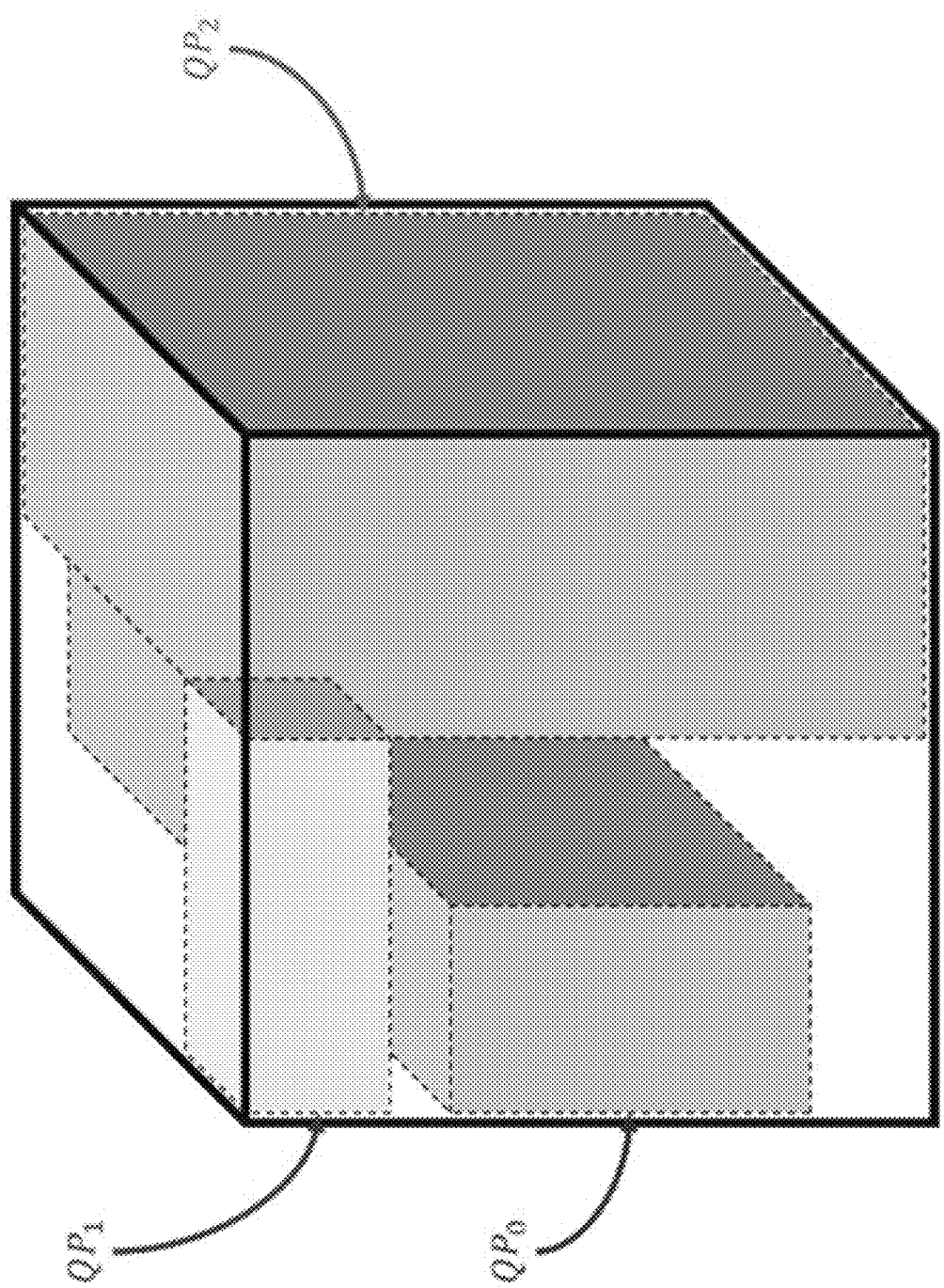
FIG. 10 shows three bounding boxes associated with different QPs according to an embodiment of the disclosure.

According to aspects of the disclosure, certain regions can be defined, for example in 3D space, and different region QPs can be assigned for different regions. This can be referred to as regions based adaptive geometry quantization, which can be specified by the bounding boxes and the corresponding region QPs. FIG. 10 shows three bounding boxes associated with different region QPs according to an embodiment of the disclosure.

In order to signal region based QP variations, first, the bounding boxes can be specified either by start and end positions or by start position and the length of each dimension. The bounding boxes can be either overlapped to each other or not. For an overlapped region where multiple region QPs are specified, one of the multiple region QPs can be applied to the overlapped region, such as the first specified one, the last specified one, the largest one among all, the smallest one among all, the mean value of all, or the median value of all, etc.

Second, the region QPs for each bounding box can be either signaled directly by their values, or signaled by differences (e.g., a difference between two QPs), or signaled as differences from a default value. It is noted that the final QPs for each region can vary in the regions based adaptive geometry quantization since delta QPs can be signaled and applied to each single region besides the region QPs. In this case, the region QPs perform like base QPs for each region. In the following embodiments, the region QPs are signaled in the sequence header of the bitstream. It is noted that they can be also signaled in the slice header.

In an embodiment, the regions are specified by the start and end positions, and the corresponding region QP values are specified for each region, as shown in Table 10.

TABLE 10

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp_flag ) { | |
|     sps_geo_region_qp_flag | u(1) |
|     If(sps_geo_region_qp_flag) { | |
|       sps_geo_region_qp_size_minus_one | ue(v) |
|       for(i=0; i < sps_geo_region_qp_size; i++) { | |
|         sps_geo_region_qp_start_pos_x [ i ] | ue(v) |
|         sps_geo_region_qp_start_pos_y [ i ] | ue(v) |
|         sps_geo_region_qp_start_pos_z [ i ] | ue(v) |
|         sps_geo_region_qp_end_pos_x [ i ] | ue(v) |
|         sps_geo_region_qp_end_pos_y [ i ] | ue(v) |
|         sps_geo_region_qp_end_pos_z [ i ] | ue(v) |
|         sps_geo_region_qp [ i ] | ue(v) |
|       } | |
|     } | |
|   } | |
|   sps_seq_parameter_set_id | ue(v) |
|   ... | ... |
|   byte_alignment( ) | |
| } | |

If the variable sps_geo_region_qp_flag equals 1, it specifies that the region based adaptive quantization is enabled. If so, the variable sps_geo_region_qp_size_minus_one specifies the number of regions as sps_geo_region_qp_size=sps_geo_region_qp_size_minus_one+1.

Then, for each region, the variables sps_geo_region_qp_start_pos_x[i], sps_geo_region_qp_start_pos_y[i], and sps_geo_region_qp_start_pos_z[i] specify the start position of the region in Cartesian coordinates, and the variables sps_geo_region_qp_end_pos_x[i], sps_geo_region_qp_end_pos_y[i], and sps_geo_region_qp_end_pos_z[i] specify the end position of the region in Cartesian coordinates, and the variable sps_geo_region_qp[i] specifies the corresponding region QP for this region. In this case, qpBase specified by the variable sps_geo_qp_base is used as the default QP for the rest regions that are not specified in the syntax.

In an embodiment, the regions are specified by the start position and length of each dimension, and the corresponding region QP values are specified for each region, as shown in Table 11.

TABLE 11

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp_flag) { | |
|     sps_geo_region_qp_flag | u(1) |
|     If(sps_geo_region_qp_flag) { | |
|       sps_geo_region_qp_size_minus_one | ue(v) |
|       for(i=0; i < sps_geo_region_qp_size; i++) { | |
|         sps_geo_region_qp_start_pos_x [ i ] | ue(v) |
|         sps_geo_region_qp_start_pos_y [ i ] | ue(v) |
|         sps_geo_region_qp_start_pos_z [ i ] | ue(v) |
|         sps_geo_region_qp_length_x [ i ] | ue(v) |
|         sps_geo_region_qp_length_y [ i ] | ue(v) |
|         sps_geo_region_qp_length_z [ i ] | ue(v) |
|         sps_geo_region_qp [ i ] | ue(v) |
|       } | |
|     } | |
|   } | |
|   sps_seq_parameter_set_id | ue(v) |
|   ... | ... |
|   byte_alignment( ) | |
| } | |

The variable sps_geo_region_qp_diff[i] specifies the corresponding QP for each region by a difference from the base QP as the variable sps_geo_region_qp[i]=qpBase+sps_geo_region_diff[i].

In this case, qpBase specified by the variable sps_geo_qp_base is also used as the default QP for the rest regions that are not specified in the syntax.

In an embodiment, the regions are specified by the start position and length of each dimension, and QP values for each region are specified by differences from a default value. In this case, the variables sps_geo_region_qp_flag and sps_geo_delta_qp_signal_depth are signaled simultaneously, therefore QP variations within a same region are allowed by signaling the delta QPs. It is noted that the variable sps_geo_region_qp_flag can be also signaled together with the variable sps_geo_delta_qp_signal_min_depth. Table 12 shows an exemplary syntax table.

TABLE 12

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp_flag){ | |
|     sps_geo_delta_qp_signal_depth | ue(v) |
|     sps_geo_region_qp_flag | u(1) |
|     If(sps_geo_region_qp_flag){ | |
|       sps_geo_region_qp_size_minus_one | ue(v) |
|       for(i=0; i < sps_geo_region_qp_size; i++) { | |
|         sps_geo_region_qp_start_pos_x [ i ] | ue(v) |
|         sps_geo_region_qp_start_pos_y [ i ] | ue(v) |
|         sps_geo_region_qp_start_pos_z [ i ] | ue(v) |
|         sps_geo_region_qp_length_x [ i ] | ue(v) |
|         sps_geo_region_qp_length_y [ i ] | ue(v) |
|         sps_geo_region_qp_length_z [ i ] | ue(v) |
|         sps_geo_region_qp_diff [ i ] | ue(v) |
|       } | |
|     } | |
|   } | |
|   sps_seq_parameter_set_id | ue(v) |
|   ... | ... |
|   byte_alignment( ) | |
| } | |

When the octree partition depth is below the specified variable sps_geo_delta_qp_signal_depth, qpBase specified by the variable sps_geo_qp_bese is used as a default. Otherwise, QPs are specified by the region QPs.

4. Signaling Delta QPs

The above sections describe exemplary high level syntaxes for signaling QP variations, this section further describes the ways of signaling delta QPs with octree coding. Each sub-node of the octree partition may be applied with a different QP, i.e., $Q^{l,k}$. The value of $Q^{l,k}$ can be signaled directly or its difference from a prediction (delta QP) can be signaled for bit saving. The delta QP of a sub-cube (or sub-node) can be then denoted as $\Delta^{l,k}=Q^{l,k}-P^{l,k}$, where $P^{l,k}$ is the predictor of delta QPs.

In some embodiments, in order to signal the value of delta QP, one bit is first signaled to indicate whether delta QP equals 0. If not, another bit is signaled to indicate a sign of delta QP, and its absolute value minus one is then signaled, for example by Exp-Golomb coding. It is noted that the sign of delta QP is not signaled if the delta QPs are restricted to be non-negative.

Alternatively, the QPs can also be signaled by indices to a defined look-up table. This table can be either fixed for an encoder and a decoder or signaled at the beginning of the bitstream. In this case, the delta QPs can be referenced by the difference indices of the look-up table.

In one embodiment, the signaling of delta QPs is dependent on the variable sps_geo_delta_qp_signal_depth (or gsh_geo_delta_qp_signal_depth), which specifies the depth of the octree partition at which the delta QPs can be signaled. Table 13 shows an exemplary syntax table.

TABLE 13

| | Descriptor |
|---|---|
| geometry_slice_data( ) { | |
|   for( depth = 0; depth < MaxGeometryOctreeDepth; depth++ ) { | |
|     for( nodeIdx = 0; nodeIdx < NumNodesAtDepth[ depth ]; nodeIdx++ ) { | |
|       if( depth == sps_geo_delta_qp_signal_depth ) { | |
|         geo_delta_qp_is_nonzero_flag | ae(v) |
|         if (geo_delta_qp_is_nonzero_flag) { | |
|           geo_delta_qp_sign | ae(v) |
|           geo_delta_qp_abs_minus_one | ue(v) |
|         } | |
|       } | |
|       // the derivation of qp is described in semantics | |
|       $Q^{l,k} = P^{l,k} + \Delta^{l,k}$ | |
|       depthShift = ilog2 ($Q^{l,k}$) | |
|       xN = NodeX[ depth ][ nodeIdx ] | |
|       yN = NodeY[ depth ][ nodeIdx ] | |
|       zN = NodeZ[ depth ][ nodeIdx ] | |
|       geometry_node( depth, nodeIdx, xN, yN, zN, depthShift ) | |
|     } | |
|   } | |
|   if ( log2_trisoup_node_size > 0 ) | |
|     geometry_trisoup_data( ) | |
| } | |

When depth==sps_geo_delta_qp_signal_depth, the delta QP of the current node, i.e., $\Delta^{l,k}$, is decoded from the bitstream. When depth !=sps_geo_delta_qp_signal_depth, $\Delta^{l,k}=0$. If $\Delta^{l,k}$ is decoded from the bitstream, it can be reconstructed as follows,

```
if( geo_delta_qp_is_nonzero_flag) {
    if( geo_delt_ qp_sign ) {
        Δ^{l,k} = geo_delta_qp_abs_minus_one + 1
    } else {
        Δ^{l,k} = geo_delta_qp_abs_minus_one – 1
    }
} else {
    Δ^{l,k} = 0
}
```

The variables NodeX[depth][nodeIdx], NodeY[depth][nodeIdx], and NodeZ[depth][nodeIdx] represent the x, y, and z coordinates of the node nodeIdx in decoding order at the given depth. The variable NumNodesAtDepth[depth] represents the number of nodes to be decoded at the given depth.

The variable depthShift specifies the change in depth value caused by $Q^{l,k}$ as follows, depthShift=i log 2($Q^{l,k}$), where i log 2(v) calculates the largest integer that is smaller than or equal to the log 2 of v. $Q^{l,k}$ is the QP applied to the current sub-node, which can be calculated as $Q^{l,k}=P^{l,k}+\Delta^{l,k}$, where $P^{l,k}$ is the predictor of delta QP. The derived parameter depthShift can impact the geometry coding of current node as shown in Table 14.

TABLE 14

| | Descriptor |
|---|---|
| geometry_node( depth, nodeIdx, xN, yN, zN, depthShift ) { | |
|   if( NeighbourPattern == 0 ) { | |
|     single_occupancy_flag | ae(v) |
|     if( single_occupancy_flag ) | |
|       occupancy_idx | ae(v) |
|   } | |

TABLE 14-continued

| | Descriptor |
|---|---|
|     if( !single_occupancy_flag ) | |
|       if( bitwise_occupancy_flag ) | |
|         occupancy_map | ae(v) |
|       else | |
|         occupancy_byte | de(v) |
|     if( depth + depthShift >= MaxGeometryOctreeDepth − 1 ) | |
|       if( !unique_geometry_points_flag ) | |
|         for( child = 0; child < GeometryNodeChildrenCnt; child++ ) { | |
|           num_points_eq1_flag [ child ] | ae(v) |
|           if( !num_points_eq1_flag ) | |
|             num_points_minus2 [ child ] | ae(v) |
|         } | |
|     } else { | |
|       if( DirectModeFlagPresent ) | |
|         direct_mode_flag | ae(v) |
|       if( direct_mode_flag ) { | |
|         num_direct_points_minus1 | ae(v) |
|         for( i = 0; i <= num_direct_points_minus1; i++ ) | |
|           for( j = 0; j < ChildNodeSizeLog2 − depthShift ; j++ ) { | |
|             point_offset_x[ i ][ j ] | ae(v) |
|             point_offset_y[ i ][ j ] | ae(v) |
|             Point_offset_z[ i ][ j ] | ae(v) |
|           } | |
|       } | |
|     } | |
| } | |

When depth+depthShift>=MaxGeometryOctreeDepth−1, it indicates that $Q^{l,k}$ is larger than the maximum and therefore all points in the current node are quantized to a single point. In this case, the octree partition can then be terminated. For direct mode in geometry coding, the coding length can be changed to ChildNodeSizeLog2−depthShift, where the variable ChildNodeSizeLog2 indicates the child node size.

In an embodiment, the signaling of delta QPs is dependent on the variable sps_geo_delta_qp_signal_min_depth (or gsh_geo_delta_qp_signal_min_depth), which specifies from a certain depth of octree partition to all the depths above the delta of QPs is signaled. Table 15 shows an exemplary syntax table.

TABLE 15

| | Descriptor |
|---|---|
| geometry_slice_data( ) { | |
|   for( depth = 0; depth < MaxGeometryOctreeDepth; depth++ ) { | |
|     for( nodeIdx = 0; nodeIdx < NumNodesAtDepth[ depth ]; nodeIdx++ ) { | |
|       if( depth >= sps_geo_delta_qp_signal_min_depth ) { | |
|         geo_delta_qp_is_nonzero_flag | ae(v) |
|         if (geo_delta_qp_is_nonzero_flag ) { | |
|           geo_delta_qp_sign | ae(v) |
|           geo_delta_qp_abs_minus_one | ue(v) |
|         } | |
|       } | |
|       // the derivation of qp is described in semantics | |
|       $Q^{l,k} = P^{l,k} + \Delta^{l,k}$ | |
|       depthShift = ilog2 ($Q^{l,k}$) | |
|       xN = NodeX[ depth ][ nodeIdx ] | |
|       yN = NodeY[ depth ][ nodeIdx ] | |
|       zN = NodeZ[ depth ][ nodeIdx ] | |
|       geometry_node( depth, nodeIdx, xN, yN, zN, depthShift ) | |
|     } | |
|   } | |
|   if ( log2_trisoup_node_size > 0 ) | |
|     geometry_trisoup_data( ) | |
| } | |

In this case, when depth>=sps_geo_delta_qp_signal_min_depth, the delta QP of the current node, i.e., $Q^{l,k}$, is decoded from the bitstream. When depth<sps_geo_delta_qp_signal_min_depth, $Q^{l,k}$=0 .

In an embodiment, the delta QP is restricted to be nonnegative, therefore the sign of delta QP is not signaled. Table 16 shows an exemplary syntax table.

TABLE 16

| | Descriptor |
|---|---|
| geometry_slice_data( ) { | |
|   for( depth = 0; depth < MaxGeometryOctreeDepth; depth++ ) { | |
|     for( nodeIdx = 0; nodeIdx < NumNodesAtDepth[ depth ]; nodeIdx++ ) { | |
|       if( depth == sps_geo_delta_qp_signal_depth ) { | |
|         geo_delta_qp_is_nonzero_flag | ae(v) |
|         if (geo_delta_qp_is_nonzero_flag ) { | |
|           geo_delta_qp_abs_minus_one | ue(v) |
|         } | |
|       } | |
|       // the derivation of qp is described in semantics | |
|       $Q^{l,k} = P^{l,k} + \Delta^{l,k}$ | |
|       depthShift = ilog2 ($Q^{l,k}$) | |
|       xN =NodeX[ depth ][ nodeIdx ] | |
|       yN = NodeY[ depth ][ nodeIdx ] | |
|       zN = NodeZ[ depth ][ nodeIdx ] | |
|       geometry_node( depth, nodeIdx, xN, yN, zN, depthShift ) | |
|     } | |
|   } | |
|   if ( log2_trisoup_node_size > 0 ) | |
|     geometry_trisoup_data( ) | |
| } | |

In this case, if $Q^{l,k}$ is decoded from the bitstream, it can be reconstructed as follows,

```
if( geo_delta_qp_is_nonzero_flag) {
    Q^{l,k} = geo_delta_qp_abs_minus_one + 1
} else {
    Q^{l,k} = 0
}
```

In an embodiment, QPs are restricted to be numbers that are a power of two, therefore the value of delta QP can be also signaled in the form of log 2. Table 17 shows an exemplary syntax table.

TABLE 17

| | Descriptor |
|---|---|
| geometry_slice_data( ) { | |
|   for( depth = 0; depth < MaxGeometryOctreeDepth; depth++ ) { | |
|     for( nodeIdx = 0; nodeIdx < NumNodesAtDepth[ depth ]; nodeIdx++ ) { | |
|       if( depth == sps_geo_delta_qp_signal_depth ) { | |
|         geo_delta_qp_is_nonzero_flag | ae(v) |
|         if (geo_delta_qp_is_nonzero_flag ) { | |
|           geo_delta_qp_sign | ae(v) |
|           geo_delta_qp_log2_abs_minus_one | ue(v) |
|         } | |
|       } | |
|       // the derivation of qp is described in semantics | |
|       $Q^{l,k} = 2^{P^{l,k}} + \Delta^{l,k}$ | |
|       depthShift = $P^{l,k} + \Delta^{l,k}$ | |
|       xN = NodeX[ depth ][ nodeIdx ] | |
|       yN = NodeY[ depth ][ nodeIdx ] | |
|       zN = NodeZ[ depth ][ nodeIdx ] | |
|       geometry_node( depth, nodeIdx, xN, yN, zN, | |

TABLE 17-continued

| | Descriptor |
|---|---|
| depthShift )<br>    }<br>  }<br>  if ( log2_trisoup_node_size > 0 )<br>    geometry_trisoup_data( )<br>} | |

In this case, if $Q^{l,k}$ is decoded from the bitstream, it can be reconstructed as follows,

| |
|---|
| if( geo_delta_qp_is_nonzero_flag ) {<br>    $Q^{l,k}$ = geo_delta_qp_log2_abs_minus_one + 1<br>} else {<br>    $Q^{l,k}$ = 0<br>} |

In this embodiment, both the prediction $P^{l,k}$ and the decoded $\Delta^{l,k}$ are in the form of log 2. Therefore, the final QP for the current node (or sub-cube) is specified as $Q^{l,k}=2^{P^{l,k}+\Delta^{l,k}}$ and depthShift=$P^{l,k}+\Delta^{l,k}$.

In an embodiment, the QP look-up table is either fixed or specified by the variables sps_geo_qp_table_flag and sps_geo_qp_table_element[i]. In this case, the QP variation can be specified by the difference of indices in the QP table. Table 18 shows an exemplary syntax table.

TABLE 18

| | Descriptor |
|---|---|
| geometry_slice_data( ) {<br>  for( depth = 0; depth < MaxGeometryOctreeDepth; depth++ ) {<br>    for( nodeIdx = 0; nodeIdx < NumNodesAtDepth[ depth ]; nodeIdx++ ) {<br>      if( depth == sps_geo_delta_qp_signal_depth ) {<br>        geo_delta_qp_is_nonzero_flag | ae(v) |
|         if (geo_delta_qp_is_nonzero_flag ) { | |
|           geo_delta_qp_sign | ae(v) |
|           geo_delta_qp_abs_minus_one | ue(v) |
|         }<br>      }<br>      // the derivation of qp is described in semantics<br>      if( sps_geo_qp_table_flag )<br>        $Q^{l,k}$ = QT$_{P^{l,k}+\Delta^{l,k}}$<br>      else<br>        $Q^{l,k}$ = $P^{l,k}$ + $\Delta^{l,k}$<br>      depthShift = ilog2 ($Q^{l,k}$)<br>      xN = NodeX[ depth ][ nodeIdx ]<br>      yN = NodeY[ depth ][ nodeIdx ]<br>      zN = NodeZ[ depth ][ nodeIdx ]<br>      geometry_node( depth, nodeIdx, xN, yN, zN, depthShift )<br>    }<br>  }<br>  if ( log2_trisoup_node_size > 0 )<br>    geometry_trisoup_data( )<br>} | |

If the variable sps_geo_qp_table_flag equals 1, the decoded $\Delta^{l,k}$ specifies the difference of indices in the look-up table, and the final QP for the current node (or sub-cube) is specified as $Q^{l,k}=QT_{P^{l,k}+\Delta^{l,k}}$, where $QT_i$ is the $i^{th}$ element in the QP table, and $P^{l,k}$ is the predictor of the index to the look-up table.

If the variable sps_geo_qp_table_flag equals 0, it indicates the look-up table is not constructed, the final QP for the current node is specified as $Q^{l,k}=P^{l,k}+\Delta^{l,k}$ where $P^{l,k}$ in this case is the predictor of delta QP values.

In an embodiment, the QP look-up table is either fixed or specified by sps_geo_qp_table_flag and sps_geo_qp_table_element[i]. In this case, the QP variation can be specified by the index in the QP table. Table 19 shows an exemplary syntax table.

TABLE 19

| | Descriptor |
|---|---|
| geometry_slice_data( ) {<br>  for( depth = 0; depth < MaxGeometryOctreeDepth; depth++ ) {<br>    for( nodeIdx = 0; nodeIdx < NumNodesAtDepth[ depth ]; nodeIdx++ ) {<br>      if( depth == sps_geo_delta_qp_signal_depth ) {<br>        geo_delta_qp_is_nonzero_flag | ae(v) |
|         if (geo_delta_qp_is_nonzero_flag ) { | |
|           geo_delta_qp_sign | ae(v) |
|           geo_delta_qp_abs_minus_one | ue(v) |
|         }<br>      }<br>      // the derivation of qp is described in semantics<br>      if( sps_geo_qp_table_flag )<br>        $Q^{l,k}$ = QT$_{\Delta^{l,k}}$<br>      else<br>        $Q^{l,k}$ = $\Delta^{l,k}$<br>      depthShift = ilog2 ($Q^{l,k}$)<br>      xN = NodeX[ depth ][ nodeIdx ]<br>      yN = NodeY[ depth ][ nodeIdx ]<br>      zN = NodeZ[ depth ][ nodeIdx ]<br>      geometry_node( depth, nodeIdx, xN, yN, zN, depthShift )<br>    }<br>  }<br>  if ( log2_trisoup_node_size > 0 )<br>    geometry_trisoup_data( )<br>} | |

If the variable sps_geo_qp_table_flag equals 1, the decoded $\Delta^{l,k}$ specifies the index in the look-up table, and the final QP for the current node (or sub-cube) is specified as $Q^{l,k}=QT_{\Delta^{l,k}}$, where $QT_i$ is the $i^{th}$ element in the QP table.

If the variable sps_geo_qp_table_flag equals 0, it indicates the look-up table is not constructed, the final QP for the current node (or sub-cube) is specified as $Q^{l,k}=\Delta^{l,k}$ In this case, the QP is specified by $\Delta^{l,k}$ directly without a predictor.

In an embodiment, the delta QP look-up table is either fixed or specified by the variables sps_geo_delta_qp_table_flag and sps_geo_delta_qp_table_element[i]. Table 20 shows an exemplary syntax table.

TABLE 20

| | Descriptor |
|---|---|
| geometry_slice_data( ) {<br>  for( depth = 0; depth < MaxGeometryOctreeDepth; depth++ ) {<br>    for( nodeIdx = 0; nodeIdx < NumNodesAtDepth[ depth ]; nodeIdx++ ) {<br>      if( depth == sps_geo_delta_qp_signal_depth ) {<br>        geo_delta_qp_is_nonzero_flag | ae(v) |
|         if (geo_delta_qp_is_nonzero_flag ) { | |
|           geo_delta_qp_sign | ae(v) |
|           geo_delta_qp_abs_minus_one | ue(v) |
|         }<br>      }<br>      // the derivation of qp is described in semantics<br>      if( sps_geo_delta_qp_table_flag )<br>        $Q^{l,k}$ = $P^{l,k}$ + DQT$_{\Delta^{l,k}}$<br>      else<br>        $Q^{l,k}$ = $P^{l,k}$ + $\Delta^{l,k}$<br>      depthShift = ilog2 ($Q^{l,k}$)<br>      xN = NodeX[ depth ][ nodeIdx ]<br>      yN = NodeY[ depth ][ nodeIdx ]<br>      zN = NodeZ[ depth ][ nodeIdx ]<br>      geometry_node( depth, nodeIdx, xN, yN, zN, | |

TABLE 20-continued

| | Descriptor |
|---|---|
| depthShift ) | |
|     } | |
|   } | |
|   if ( log2_trisoup_node_size > 0 ) | |
|     geometry_trisoup_data( ) | |
| } | |

If the variable sps_geo_delta_qp_table_flag equals 1, the decoded $\Delta^{l,k}$ specifies the index in the delta QP look-up table, and the final QP for the current node is specified as $Q^{l,k}=P^{l,k}+DQT_{\Delta^{l,k}}$, where $DQT_i$ is the $i^{th}$ element in the delta QP table, and $P^{l,k}$ is the predictor of delta QP.

5. Predictor of Delta QPs

According to aspects of the disclosure, the predictor of delta QPs, i.e., $P^{l,k}$, can be from a QP of a parent node of the current node, i.e., $$P^{l,k} = Q^{l-1,\lfloor \frac{k}{8} \rfloor},$$

or can be from a QP of one of previously coded sibling nodes of the current node in the same partition depth, i.e., $P^{l,k}=Q^{l,j}$, where j<k, or can be from the base QP, i.e., $P^{l,k}$=qpBase, or can be any combination (e.g., average or median value) of the aforementioned predictors.

In an embodiment, a selection of the predictor can be fixed for all cases. In an alternative embodiment, a candidate list of the predictors can be constructed and an index to the list can be signaled to indicate which predictor is applied. This index can be specified in either the sequence header or slice header or geometry slice data while parsing the octree partition.

In an embodiment, the index indicating the source of a predictor is specified in the sequence header as shown in Table 21.

TABLE 21

| | Descriptor |
|---|---|
| seq_parameter_set( ) { | |
|   profile_compatibility_flags | u(24) |
|   level_idc | u(8) |
|   ... | ... |
|   sps_source_scale_factor | u(32) |
|   sps_geo_qp_base | ue(v) |
|   sps_geo_delta_qp_flag | u(1) |
|   if( sps_geo_delta_qp_flag) { | |
|     sps_geo_delta_qp_signal_depth | ue(v) |
|     sps_geo_delta_qp_predict_from_index | ue(v) |
|   } | |
|   sps_seq_parameter_set_id | ue(v) |
|   ... | ... |
|   byte_alignment( ) | |
| } | |

If the variable sps_geo_delta_qp_predict_from_index equals 0, it specifies that the predictor is from the base QP, i.e., $P^{l,k}$=qpBase. If the variable sps_geo_delta_qp_predict_from_index equals 1, it specifies that the predictor is from the QP of the parent node, i.e., $$P^{l,k} = Q^{l-1,\lfloor \frac{k}{8} \rfloor}.$$

If the variable sps_geo_delta_qp_predict_from_index equals 2, it specifies that the predictor is from the QP of the previously coded sibling node in the same partition depth, i.e. $P^{l,k}=Q^{l,k-1}$.

6. Octree-Level Geometry Quantization

According to aspects of the disclosure, the proposed adaptive geometry quantization is applied at a certain octree partition depth, where the depth is specified in the high-level syntax.

In an embodiment, a controlling flag is added to the geometry parameter set to indicate whether the signaling of QP variations is enabled. If it is enabled, then a base QP is signaled as the predictor when signaling the QP differences. Table 22 shows an exemplary syntax table.

TABLE 22

| | Descriptor |
|---|---|
| geometry_parameter_set( ) { | |
|   gps_geom_parameter_set_id | ue(v) |
|   gps_seq_parameter_set_id | ue(v) |
|   gps_box_present_flag | u(1) |
|   if( gps_box_present_flag ){ | |
|     gps_gsh_box_log2_scale_present_flag | u(1) |
|     if( gps_gsh_box_log2_scale_present_flag == 0 ) | |
|       gps_gsh_box_log2_scale | ue(v) |
|   } | |
|   unique_geometry_points_flag | u(1) |
|   neighbour_context_restriction_flag | u(1) |
|   inferred_direct_coding_mode_enabled_flag | u(1) |
|   bitwise_occupancy_coding_flag | u(1) |
|   adjacent_child_contextualization_enabled_flag | u(1) |
|   log2_neighbour_avail_boundary | ue(v) |
|   log2_intra_pred_max_node_size | ue(v) |
|   log2_trisoup_node_size | ue(v) |
|   gps_geo_delta_qp_flag | u(1) |
|   if ( gps_geo_delta_qp _flag ) { | |
|     gps_geo_qp_base | ue(v) |
|   } | |
|   gps_extension_present_flag | u(1) |
|   if( gps_extension_present_flag ) | |
|     while( more_data_in_byte_stream( ) ) | |
|       gps_extension_data_flag | u(1) |
|   byte_alignment( ) | |
| } | |

If the variable gps_geo_delta_qp_flag equals 1, it specifies that the signaling of QP variations is enabled. If the variable gps_geo_delta_qp_flag equals 0, it specifies that the signaling of QP variations is disabled. If the signaling of QP variations is enabled, the variable gps_geo_qp_base specifies the base QP that can be used in signaling QP differences as baseQP=gps_geo_qp_base.

The syntax changes in geometry slice header are as shown in Table 23.

TABLE 23

| | Descriptor |
|---|---|
| geometry_slice_header( ) { | |
|   gsh_geometry_parameter_set_id | ue(v) |
|   gsh_tile_id | ue(v) |
|   gsh_slice_id | ue(v) |
|   if( gps_box_present_flag ) { | |
|     gsh_box_log2_scale | ue(v) |
|     gsh_box_origin_x | ue(v) |
|     gsh_box_origin_y | ue(v) |
|     gsh_box_origin_z | ue(v) |
|   } | |
|   gsh_log2_max_nodesize | ue(v) |
|   if ( gps_geo_delta_qp_flag ) { | |
|     gsh_geo_octree_delta_qp_flag | u(1) |
|     if (gsh_geo_octree_delta_qp_flag ) { | |
|       gsh_geo_octree_delta_qp_depth | ue(v) |
|     } | |
|   } | |

TABLE 23-continued

| | Descriptor |
|---|---|
| gsh_num_points | ue(v) |
| byte_alignment( ) | |
| } | |

If the variable gsh_geo_octree_delta_qp_flag equals 1, it specifies that the octree-based delta QP signaling is enabled in a current slice. If the variable gsh_geo_octree_delta_qp_flag equals 0, it specifies that the octree-based delta QP signaling is disabled in a current slice. If the octree-based delta QP signaling is enabled, the variable gsh_geo_octree_delta_qp_depth specifies the depth of octree partition at which the delta of QP is signaled.

In an embodiment, in order to signal the value of the delta QP, one bit is first signaled to indicate if the delta QP equals 0. If not, another bit is encoded and signaled to indicate the sign of the delta QP, and its absolute value minus one is then coded by Exp-Golomb coding. The delta QP signaling is in the geometry slice data is shown in Table 24.

TABLE 24

| | Descriptor |
|---|---|
| geometry_slice_data( ) { | |
|   for( depth = 0; depth < MaxGeometryOctreeDepth; depth++ ) { | |
|     for( nodeIdx = 0; nodeIdx < NumNodesAtDepth[ depth ]; nodeIdx++ ) { | |
|       if (gsh_geo_octree_delta_qp_flag && depth = = gsh_geo_octree_delta_qp_depth ) { | |
|         geo_delta_qp_is_nonzero_flag | ae(v) |
|         if ( geo_delta_qp_is_nonzero_flag ) { | |
|           geo_delta_qp_sign | ae(v) |
|           geo_delta_qp_abs_minus_one | ue(v) |
|         } | |
|       geoOctreeQP[depth][nodeIdx] = geo_octree_dqp + baseQP | |
|       NodeBaseX[ depth ][ nodeIdx ] = NodeX[ depth ][ nodeIdx ] | |
|       NodeBaseY[ depth ][ nodeIdx ] = NodeY[ depth ][ nodeIdx ] | |
|       NodeBaseZ[ depth][ nodeIdx ] = NodeZ[ depth ][ nodeIdx ] | |
|       NodeQuantX[ depth ][ nodeIdx ] = 0 | |
|       NodeQuantY[ depth ][ nodeIdx ] = 0 | |
|       NodeQuantZ[ depth ][ nodeIdx ] = 0 | |
|     } | |
|     geoQp = geoOctreeQP[depth][nodeIdx] | |
|     depthShift = floor((geoQp − 4 ) / 6) | |
|     xNBase = NodeBaseX[ depth ][ nodeIdx ] | |
|     yNBase = NodeBaseY[ depth ][ nodeIdx ] | |
|     zNBase = NodeBaseZ[ depth ][ nodeIdx ] | |
|     xNQuant = NodeQuantX[ depth ][ nodeIdx ] | |
|     yNQuant = NodeQuantY[ depth ][ nodeIdx ] | |
|     zNQuant = NodeQuantZ[ depth ][ nodeIdx ] | |
|     xN = NodeX[ depth ][ nodeIdx ] | |
|     yN = NodeY[ depth ][ nodeIdx ] | |
|     zN = NodeZ[ depth ][ nodeIdx ] | |
|     geometry_node( depth, nodeIdx, xN, yN, zN, xNQuant, yNQuant, zNQuant, xNBase, yNBase, zNBase, geoQp, depthShift ) | |
|     } | |
|   } | |
|   if ( log2_trisoup_node_size > 0) | |
|     geometry_trisoup_data( ) | |
| } | |

The variable GeometryNodeOccupancyCnt[depth][xN][yN][zN] represents the number of child nodes present in the geometry octree node at position (xN, yN, zN) at the given depth of the octree. Undefined values of the variable GeometryNodeOccupancyCnt are treated as 0.

The variables NodeX[depth][idx], NodeY[depth][idx], and NodeZ[depth][idx] represent the x, y, and z coordinates of the idx-th node in decoding order at the given depth. The variable NumNodesAtDepth[depth] represents the number of nodes to be decoded at the given depth.

The variables NodeBaseX[depth][idx], NodeBaseY[depth][idx], and NodeBaseZ[depth][idx] represent the base x, y, and z coordinates of the quantized position of the idx-th node in decoding order at the given depth. The variables NodeQuantX[depth][idx], NodeQuantY[depth][idx], and NodeQuantZ[depth][idx] represent the quantized x, y, and z coordinates relative to the base position of the idx-th node in decoding order at the given depth. The variable geoOctreeQP[depth][nodeIdx] indicates the QP the nodeIdx-th node in decoding order at the given depth.

The variables NodeX, NodeY, NodeZ, NodeBaseX, NodeBaseY, NodeBaseZ, NodeQuantX, NodeQuantY, NodeQuantZ, geoQp, NumNodesAtDepth, GeometryNodeOccupancyCnt and GeometryNodeOccupancyMap are initialized as follows:

NodeX[0]=NodeY[0]=NodeZ[0]=0
NumNodesAtDepth[0]=1
GeometryNodeOccupancyCnt[−1][0][0][0]=8
geoOctreeQP[0]=4
NodeBaseX[0]=NodeBaseY[0]=NodeBaseZ[0]=0
NodeQuantX[0]=NodeQuantY[0]=NodeQuantZ[0]=0

When the variable gsh_geo_octree_delta_qp_flag equals 1 and depth equals the variable gsh_geo_octree_delta_qp_depth, the delta QP of the current node, i.e., the variable geo_octree_dqp, is specified as follows,

```
if( geo_delta_qp_is_nonzero_flag) {
   if( geo_delta_qp_sign )
      geo_octree_dqp = geo_delta_qp_abs_minus_one + 1;
   else
      geo_octree_dqp = − geo_delta_qp_abs_minus_one − 1;
} else
   geo_octree_dqp = 0;
```

When the variable geo_octree_dqp is decoded, the variable geoOctreeQP[depth][nodeIdx] is updated as follows,
  geoOctreeQP[depth][nodeIdx]=geo_octree_dqp+baseQP.
The QS for current node can be derived as follows,
  geoQp=geoOctreeQP[depth][nodeIdx],
  geoOctreeQS=geomLevelScale[geoQp % 6]<<(geoQp/6),
where the variable geomLevelScale [k]={659445, 741374, 831472, 933892, 1048576, 1175576} with k=0 . . . 5.

The variable depthShift specifies the shifting in geometry bit-depth as follows,
  depthShift=floor ((geoQp−4)/6).

The derived parameter depthShift can impact the geometry coding of current node as shown in Table 25.

TABLE 25

| | Descriptor |
|---|---|
| geometry_node( depth, nodeIdx, xN, yN, zN, xNQuant, yNQuant, zNQuant, xNBase, yNBase, zNBase, geoQp, depthShift ) { | |
|   if ( (depth + depthShift) < MaxGeometryOctreeDepth − 1 ) { | |
|     if( NeighbourPattern = = 0 ) { | |
|       single_occupancy_flag | ae(v) |
|       if( single_occupancy_flag ) | |
|         occupancy_idx | ae(v) |
|     } | |
|     if( !single_occupancy_flag ) | |
|       if( bitwise_occupancy_flag ) | |
|         occupancy_map | ae(v) |
|       else | |
|         occupancy_byte | de(v) |
|   } | |
|   if( (depth + depthShift) >= MaxGeometryOctreeDepth − 1 ) { | |
|     if( !unique_geometry_points_flag ) | |
|       for( child = 0; child < GeometryNodeChildrenCnt; child++ ) { | |
|         num_points_eq1_flag [ child ] | ae(v) |
|         if( !num_points_eq1_flag ) | |
|           num_points_minus2 [ child ] | ae(v) |
|       } | |
|   } else { | |
|     if( DirectModeFlagPresent ) | |
|       direct_modeflag | ae(v) |
|     if( direct_mode_flag ) { | |
|       num_direct_points_minus1 | ae(v) |
|       for( i = 0; i < = num_direct_points_minus1; i++ ) | |
|       for( j = 0; j < ChildNodeSizeLog2 − depthShift; j++ ) { | |
|         point_offset_x[ i ][ j ] | ae(v) |
|         point_offset_y[ i ][ j ] | ae(v) |
|         Point_offset_z[ i ][ j ] | ae(v) |
|       } | |
|     } | |
|   } | |
| } | |

When (depth+depthShift)>=MaxGeometryOctreeDepth−1, it indicates that the internal quantization is large enough such that all points in the current sub-cube or node are quantized into a single point. In this case, the octree partition may terminate, and the occupancy coding can be skipped because the variable OccupancyMap can be inferred to be 1. For inferred direct coding mode (IDCM) in geometry coding, the coding length is changed to ChildNodeSizeLog2−depthShift, where the variable ChildNodeSizeLog2 indicates the child node size.

When the variable direct_mode_flag is equal to 0, the following applies:

```
nodeIdx = NumNodesAtDepth[ depth + 1 ]
for( child = 0; child < GeometryNodeChildrenCnt; child++) {
  childIdx = GeometryNodeChildren[ child ]
  x = NodeX[ depth + 1 ][ nodeIdx ] = 2 × xN + ( childIdx & 4 = = 1 )
  y = NodeY[ depth + 1 ][ nodeIdx ] = 2 × yN + ( childIdx & 2 = = 1 )
  z = NodeZ[ depth + 1 ][ nodeIdx ] = 2 × zN + ( childIdx & 1 = = 1 )
  NodeQuantX[ depth + 1 ][ nodeIdx ] = x
  NodeQuantY[ depth + 1 ][ nodeIdx ] = y
  NodeQuantZ[ depth + 1 ][ nodeIdx ] = z
  NodeBaseX[ depth + 1 ][ nodeIdx ] = xNBase
  NodeBaseY[ depth + 1 ][ nodeIdx ] = yNBase
  NodeBaseZ[ depth + 1 ][ nodeIdx ] = zNBase
  geoOctreeQP[ depth + 1 ][ nodeIdx ] = geoQp
  GeometryNodeOccupancyCnt[ depth + 1 ][ x ][ y ][ z ] = 1
  nodeIdx++
}
NumNodesAtDepth[ depth + 1 ] = nodeIdx
```

7. Octree Node Decoding Process for Octree-Level Geometry Quantization

The inputs to this process include: (1) an octree node location (depth, nodeIdx) specifying the position of the current geometry octree node in the packed geometry octree; (2) a spatial location (xN, yN, zN) specifying the position of the current geometry octree node in the current slice; (3) a spatial location (xNBase, yNBase, zNBase) specifying the base position of the current geometry octree node in the current slice, where the geometry quantization with a QP is applied; and (4) a spatial location (xNQuant, yNQuant, zNQuant) specifying the quantized position of the current geometry octree node in the current slice, relative to the base position specified by (xNBase, yNBase, zNBase).

The outputs of this process are the modified array Point-Pos and the updated variable PointCount.

If neither depths are equal to MaxGeometryOctreeDepth−1, and the variable direct_mode_flag is equal to 0, no points are output by this process. Otherwise, if either depth is equal to MaxGeometryOctreeDepth−1, or the variable direct_mode_flag is equal to 1, the remainder of this process generates one or more point positions.

The spatial location of points in each occupied child can be determined according to the number of duplicate points in each child and the use of direct coded positions as follows:

```
for( child = 0; child < GeometryNodeChildrenCnt; child++) {
    childIdx = GeometryNodeChildren[ child ];
    x = 2 × xNBase + ( childIdx & 4 = = 1 );
    y = 2 × yNBase + ( childIdx & 2 = = 1 );
    z = 2 × zNBase + ( childIdx & 1 = = 1 );
    for( i = 0; i < GeometryNodeDupPoints[ child ] + 1 ; i++,
    PointCount++) {
        PointPos[ PointCount ][ 0 ] = (x * geoOctreeQS + (1 << 19))
>> 20 +
xNBase;
        PointPos[ PointCount ][ 1 ] = (y * geoOctreeQS + (1 << 19))
>> 20 +
yNBase;
        PointPos[ PointCount ][ 2 ] = (z * geoOctreeQS + (1 << 19))
>> 20 +
zNBase;
    }
    if( direct_mode_flag ) {
        for( i = 0; i <= num_direct_points_minus1; i++, PointCount++) {
            PointPos[ PointCount ][ 0 ] = ((x + PointOffsetX[ i ]) *
geoOctreeQS + (1 << 19)) >> 20 + xNBase;
            PointPos[ PointCount ][ 1 ] = ((y + PointOffsetY[ i ]) *
geoOctreeQS + (1 << 19)) >> 20 + yNBase;
            PointPos[ PointCount ][ 2 ] = ((z + PointOffsetZ[ i ]) *
geoOctreeQS + (1 << 19)) >> 20 + zNBase;
        }
    }
}
```

8. Slice-Level Geometry Quantization

According to aspects of the disclosure, the QP variation can be specified at the slice level, indicating each slice can be assigned a different QP.

In an embodiment, an activation flag is added to the geometry parameter set to indicate whether the signaling QP variations is enabled at a slice level. If it is enabled, a base QP is signaled as the predictor when signaling the QP differences.

The syntax changes in a geometry parameter set are shown in Table 26.

TABLE 26

|  | Descriptor |
| --- | --- |
| geometry_parameter_set( ) { |  |
| gps_geom_parameter_set_id | ue(v) |
| gps_seq_parameter_set_id | ue(v) |
| gps_box_present_flag | u(1) |
| if( gps_box_present_flag ){ |  |
| gps_gsh_box_log2_scale_present_flag | u(1) |
| if( gps_gsh_box_log2_scale_present_flag = = 0 ) |  |
| gps_gsh_box_log2_scale | ue(v) |
| } |  |
| unique_geometry_points_flag | u(1) |
| neighbour_context_restriction_flag | u(1) |
| inferred_direct_coding_mode_enabled_flag | u(1) |
| bitwise_occupancy_coding_flag | u(1) |
| adjacent_child_contextualization_enabled_flag | u(1) |
| log2_neighbour_avail_boundary | ue(v) |
| log2_intra_pred_max_node_size | ue(v) |

TABLE 26-continued

|  | Descriptor |
| --- | --- |
| log2_trisoup_node_size | ue(v) |
| gps_geo_delta_qp_flag | u(1) |
| if( gps_geo_delta_qp _flag ) { |  |
| gps_geo_qp_base | ue(v) |
| } |  |
| gps_extension_present_flag | u(1) |
| if( gps_extension_present_flag ) |  |
| while( more_data_in_byte_stream( ) ) |  |
| gps_extension_data_flag | u(1) |
| byte_alignment( ) |  |
| } |  |

If the variable gps_geo_delta_qp_flag equals 1, it specifies that the delta QP signaling is enabled. If the variable gps_geo_delta_qp_flag equals 0, it specifies that the delta QP signaling is disabled. If the delta QP signaling is enabled, the variable gps_geo_qp_base specifies the base QP that can be used in signaling QP differences as baseQP= gps_geo_qp_base. The syntax changes in geometry slice header are shown in Table 27.

TABLE 27

|  | Descriptor |
| --- | --- |
| geometry_slice_header( ) { |  |
| gsh_geometry_parameter_set_id | ue(v) |
| gsh_tile_id | ue(v) |
| gsh_slice_id | ue(v) |
| if( gps_box_present_flag ) { |  |
| gsh_box_log2_scale | ue(v) |
| gsh_box_origin_x | ue(v) |
| gsh_box_origin_y | ue(v) |
| gsh_box_origin_z | ue(v) |
| } |  |
| gsh_log2_max_nodesize | ue(v) |
| if ( gps_geo_delta_qp_flag ) { |  |
| gsh_geo_slice_dqp | se(v) |
| } |  |
| gsh_num_points | ue(v) |
| byte_alignment( ) |  |
| } |  |

The variable gsh_geo_slice_dqp specifies the QP that can be applied for the current slice as sliceQP=gsh_geo_slice_dqp+baseQP. The QS can then be derived as geoSliceQS=geomLevelScale[sliceQP % 6]<<(sliceQP/6), where geomLevelScale[k]={659445, 741374, 831472, 933892, 1048576, 1175576} with k=0 . . . 5.

After octree decoding process of the current slice is finished, the following dequantization process is applied:

```
for (1 = 0; i < PointCount; i++) {
    PointPos[ i ][ 0 ] = (PointPos[ i ][ 0 ] *
geoSliceQS + (1 << 19)) >> 20;
    PointPos[ i ][ 1 ] = (PointPos[ i ][ 1 ] *
geoSliceQS + (1 << 19)) >> 20;
    PointPos[ i ][ 2 ] = (PointPos[ i ][ 2 ] *
geoSliceQS + (1 << 19)) >> 20;
}
```

9. Combination of Slice-Level and Octree-Level Geometry Quantization

According to aspects of the disclosure, the slice-based geometry quantization can be aligned with the octree-based geometry quantization. Instead of applying two internal quantization steps, they can be merged into one single operation, i.e., an internal quantization in the octree-level. The solution is as follows: (1) if only the octree-based quantization is enabled, it is the same with octree-based scheme, where the internal quantization is applied at a certain specified octree partition depth; (2) if only the slice-based quantization is enabled, the internal quantization can be applied in the first octree partition depth; and (3) if both the slice-based and octree-based quantization are enabled, the actual quantization can be applied at the octree partition depth specified in octree-based scheme. The slice-level determined QP can be used as the base QP for signaling the delta QP at octree-level.

In an embodiment, a controlling flag is added to the geometry parameter set to indicate whether the signaling of QP variations is enabled. If it is enabled, then a base QP is signaled as the predictor when signaling the QP differences at slice-level.

The syntax changes in geometry parameter set are shown in Table 28.

TABLE 28

|  | Descriptor |
| --- | --- |
| geometry_parameter_set( ) { |  |
|   gps_geom_parameter_set_id | ue(v) |
|   gps_seq_parameter_set_id | ue(v) |
|   gps_box_present_flag | u(1) |
|   if( gps_box_present_flag ){ |  |
|     gps_gsh_box_log2_scale_present_flag | u(1) |
|     if( gps_gsh_box_log2_scale_present_flag = = 0 ) |  |
|       gps_gsh_box_log2_scale | ue(v) |
|   } |  |
|   unique_geometry_points_flag | u(1) |
|   neighbour_context_restriction_flag | u(1) |
|   inferred_direct_coding_mode_enabled_flag | u(1) |
|   bitwise_occupancy_coding_flag | u(1) |
|   adjacent_child_contextualization_enabled_flag | u(1) |
|   log2_neighbour_avail_boundary | ue(v) |
|   log2_intra_pred_max_node_size | ue(v) |
|   log2_trisoup_node_size | ue(v) |
|   gps_geo_delta_qp_flag | u(1) |
|   if ( gps_geo_delta_qp _flag ) { |  |
|     gps_geo_qp_base | ue(v) |
|   } |  |
|   gps_extension_present_flag | u(1) |
|   if( gps_extension_present_flag ) |  |
|     while( more_data_in_byte_stream( ) ) |  |
|       gps_extension_data_flag | u(1) |
|   byte_alignment( ) |  |
| } |  |

If the variable gps_geo_delta_qp_flag equals 1, it specifies that the signaling of QP variations is enabled. If the variable gps_geo_delta_qp_flag equals 0, it specifies that the signaling of QP variations is disabled. If the signaling of QP variations is enabled, the variable gps_geo_qp_base specifies the base QP that can be used in signaling QP differences as baseQP=gps_geo_qp_base.

The syntax changes in geometry slice header are shown in Table 29.

TABLE 29

|  | Descriptor |
| --- | --- |
| geometry_slice_header( ) { |  |
|   gsh_geometry_parameter_set_id | ue(v) |
|   gsh_tile_id | ue(v) |
|   gsh_slice_id | ue(v) |
|   if( gps_box_present_flag ) { |  |
|     gsh_box_log2_scale | ue(v) |
|     gsh_box_origin_x | ue(v) |
|     gsh_box_origin_y | ue(v) |
|     gsh_box_origin_z | ue(v) |
|   } |  |
|   gsh_log2_max_nodesize | ue(v) |
|   if ( gps_geo_delta_qp_flag ) { |  |
|     gsh_geo_slice_dqp | se(v) |
|     gsh_geo_octree_delta_qp_flag | u(1) |
|     if (gsh_geo_octree_delta_qp_flag ) |  |
|       gsh_geo_octree_delta_qp_depth | ue(v) |
|     else |  |
|       gsh_geo_octree_delta_qp_depth = 0 |  |
|   } |  |
|   gsh_num_points | ue(v) |
|   byte_alignment( ) |  |
| } |  |

The variable gsh_geo_slice_dqp specifies the QP that will be applied as the base QP in current slice as slice QP=gsh_geo_slice_dqp+baseQP.

If the variable gsh_geo_octree_delta_qp_flag equals 1, it specifies that the octree-based delta QP signaling is enabled in current slice. If the variable gsh_geo_octree_delta_qp_flag equals 0, it specifies that the octree-based delta QP signaling is disabled in current slice. If the variable gsh_geo_octree_delta_qp_flag equals 1, the variable gsh_geo_octree_delta_qp_depth specifies the depth of the octree partition at which the delta of QP is signaled. If the variable gsh_geo_octree_delta_qp_flag equals 0, the variable gsh_geo_octree_delta_qp_depth is inferred to be 0, indicating the quantization can be applied at the first octree partition depth.

In an embodiment, in order to signal the value of the delta QP in octree-level, one bit is first signaled to indicate if the delta QP equals 0. If not, another bit is encoded and signaled to indicate the sign of delta QP, and its absolute value minus one is then coded by Exp-Golomb coding. The delta QP signaling is in the geometry slice data is shown in Table 30.

TABLE 30

|  | Descriptor |
| --- | --- |
| geometry_slice_data( ) { |  |
|   for( depth = 0; depth < MaxGeometryOctreeDepth; depth++ ) { |  |
|     for( nodeIdx = 0; nodeIdx < NumNodesAtDepth[ depth ]; nodeIdx++ ) { |  |
|       if (gsh_geo_octree_delta_qp_flag && depth == gsh_geo_octree_delta_qp_depth ) { |  |
|         geo_delta_qp_is_nonzero_flag | ae(v) |
|         if ( geo_delta_qp_is_nonzero_flag ) { |  |
|           geo_delta_qp_sign | ae(v) |
|           geo_delta_qp_abs_minus_one | ue(v) |
|         } |  |
|       geoOctreeQP[depth][nodeIdx] = geo_octree_dqp + baseQP |  |
|       NodeBaseX[ depth ][ nodeIdx ] = NodeX[ depth ][ nodeIdx ] |  |
|       NodeBaseY[ depth ][ nodeIdx ] = NodeY[ depth ][ nodeIdx ] |  |
|       NodeBaseZ[ depth ][ nodeIdx ] = NodeZ[ depth ][ nodeIdx ] |  |
|       NodeQuantX[ depth ][ nodeIdx ] = 0 |  |

TABLE 30-continued

| | Descriptor |
|---|---|

```
                NodeQuantY[ depth ][ nodeIdx ] = 0
                NodeQuantZ[ depth ][ nodeIdx ] = 0
            }
            geoQp = geoOctreeQP[depth][nodeIdx]
            depthShift = floor((geoQp − 4 ) / 6)
            xNBase = NodeBaseX[ depth ][ nodeIdx ]
            yNBase = NodeBaseY[ depth ][ nodeIdx ]
            zNBase = NodeBaseZ[ depth ][ nodeIdx ]
            xNQuant = NodeQuantX[ depth ][ nodeIdx ]
            yNQuant = NodeQuantY[ depth ][ nodeIdx ]
            zNQuant = NodeQuantZ[ depth ][ nodeIdx ]
            xN = NodeX[ depth ][ nodeIdx ]
            yN = NodeY[ depth ][ nodeIdx ]
            zN = NodeZ[ depth ][ nodeIdx ]
            geometry_node( depth, nodeIdx, xN, yN, zN, xNQuant, yNQuant, zNQuant,
xNBase,
yNBase, zNBase, geoQp, depthShift )
        }
    }
    if ( log2_trisoup_node_size > 0 )
        geometry_trisoup_data( )
}
```

The variable GeometryNodeOccupancyCnt[depth][xN][yN][zN] represents the number of child nodes present in the geometry octree node at position (xN, yN, zN) at the given depth of the octree. Undefined values of the variable GeometryNodeOccupancyCnt are treated as 0.

The variables NodeX[depth][idx], NodeY[depth][idx], and NodeZ[depth][idx] represent the x, y, and z coordinates of the idx-th node in decoding order at the given depth. The variable NumNodesAtDepth[depth] represents the number of nodes to be decoded at the given depth.

The variables NodeBaseX[depth][idx], NodeBaseY[depth][idx], and NodeBaseZ[depth][idx] represent the base x, y, and z coordinates of the quantized position of the idx-th node in decoding order at the given depth. The variables NodeQuantX[depth][idx], NodeQuantY[depth][idx], and NodeQuantZ[depth][idx] represent the quantized x, y, and z coordinates relative to the base position of the idx-th node in decoding order at the given depth. The variable geoOctreeQP[depth][nodeIdx] indicates the QP the nodeIdx-th node in decoding order at the given depth.

The variables NodeX, NodeY, NodeZ, NodeBaseX, NodeBaseY, NodeBaseZ, NodeQuantX, NodeQuantY, NodeQuantZ, geoQp, NumNodesAtDepth, GeometryNodeOccupancyCnt and GeometryNodeOccupancyMap are initialized as follows:

NodeX[0]=NodeY[0]=NodeZ[0]=0
NumNodesAtDepth[0]=1
GeometryNodeOccupancyCnt[−1][0][0][0]=8
geoOctreeQP[0]=4
NodeBaseX[0]=NodeBaseY[0]=NodeBaseZ[0]=0
NodeQuantX[0]=NodeQuantY[0]=NodeQuantZ[0]=0

When the variable gsh_geo_octree_delta_qp_flag equals 1 and depth equals the variable gsh_geo_octree_delta_qp_depth, the delta QP of the current node, i.e., the variable geo_octree_dqp, is specified as follows,

```
if( geo_delta_qp_is_nonzero_flag) {
    if( geo_delta_qp_sign )
        geo_octree_dqp = geo_delta_qp_abs_minus_one + 1;
    else
        geo_octree_dqp = − geo_delta_qp_abs_minus_one − 1;
} else
    geo_octree_dqp = 0;
```

When the variable geo_octree_dqp is decoded, the variable geoOctreeQP[depth][nodeIdx] is updated as the variable geoOctreeQP[depth][nodeIdx]=geo_octree_dqp+baseQP.

The QS for current node can be derived as follows, geoQp=geoOctreeQP[depth][nodeIdx], geoOctreeQS=geomLevelScale[geoQp % 6]<<(geoQp/6), where geomLevelScale[k]=659445, 741374, 831472, 933892, 1048576, 1175576 with k=0 . . . 5.

The variable depthShift specifies the shifting in geometry bit-depth as depthShift=floor((geoQp−4)/6).

The derived parameter depthShift can impact the geometry coding of current node as shown in Table 31.

TABLE 31

| | Descriptor |
|---|---|

```
geometry_node( depth, nodeIdx, xN, yN, zN, xNQuant, yNQuant, zNQuant, xNBase,
yNBase, zNBase, geoQp, depthShift ) {
    if ( (depth + depthShift) < MaxGeometryOctreeDepth − 1 ) {
        if( NeighbourPattern = = 0 ) {
            single_occupancy_flag                                                  ae(v)
            if( single_occupancy_flag )
                occupancy_idx                                                      ae(v)
        }
```

TABLE 31-continued

| | Descriptor |
|---|---|
| ```
    if( !single_occupancy_flag )
      if( bitwise_occupancy_flag )
        occupancy_map
      else
        occupancy_byte
  }
  if( (depth + depthShift) >= MaxGeometryOctreeDepth − 1 ) {
    if( !unique_geometry_points_flag )
      for( child = 0; child < GeometryNodeChildrenCnt; child++ ) {
        num_points_eq1_flag [ child ]
        if( !num_points_eq1_flag )
          num_points_minus2 [ child ]
      }
  } else {
    if( DirectModeFlagPresent )
      direct_mode_flag
    if( direct_mode_flag ) {
      num_direct_points_minus1
      for( i = 0; i <= num_direct_points_minus1; i++ )
        for( j = 0; j < ChildNodeSizeLog2 − depthShift ; j++ ) {
          point_offset_x[ i ][ j ]
          point_offset_y[ i ][ j ]
          Point_offset_z[ i ][ j ]
        }
    }
  }
}
``` | ae(v)<br>de(v)<br><br><br><br>ae(v)<br><br>ae(v)<br><br><br><br>ae(v)<br><br>ae(v)<br><br><br>ae(v)<br>ae(v)<br>ae(v) |

When (depth+depthShift)>=MaxGeometryOctreeDepth−1, it indicates that the internal quantization is large enough such that all points in the current node are quantized into a single point. In this case, the octree partition may terminate, and the occupancy coding can be skipped because the variable OccupancyMap can be inferred to be 1. For IDCM mode in geometry coding, the coding length is changed to ChildNodeSizeLog2−depthShift, where the variable ChildNodeSizeLog2 indicates the child node size.

When the variable direct_mode_flag is equal to 0, the following applies:

```
nodeIdx = NumNodesAtDepth[ depth + 1 ]
for( child = 0; child < GeometryNodeChildrenCnt; child++) {
  childIdx = GeometryNodeChildren[ child ]
  x = NodeX[ depth + 1 ][ nodeIdx ] = 2 × xN + ( childIdx & 4 = = 1 )
  y = NodeY[ depth + 1 ][ nodeIdx ] = 2 × yN + ( childIdx & 2 = = 1 )
  z = NodeZ[ depth + 1 ][ nodeIdx ] = 2 × zN + ( childIdx & 1 = = 1 )
  NodeQuantX[ depth + 1 ][ nodeIdx ] = x
  NodeQuantY[ depth + 1 ][ nodeIdx ] = y
  NodeQuantZ[ depth + 1 ][ nodeIdx ] = z
  NodeBaseX[ depth + 1 ][ nodeIdx ] = xNBase
  NodeBaseY[ depth + 1 ][ nodeIdx ] = yNBase
  NodeBaseZ[ depth + 1 ][ nodeIdx ] = zNBase
  geoOctreeQP[ depth + 1 ][ nodeIdx ] = geoQp
  GeometryNodeOccupancyCnt[ depth + 1 ][ x ][ y ][ z ] = 1
  nodeIdx++
}
NumNodesAtDepth[ depth + 1 ] = nodeIdx
```

10. Octree Node Decoding Process for Combination of Slice-Level and Octree-Level Geometry Quantization The inputs to this process include: (1) an octree node location (depth, nodeIdx) specifying the position of the current geometry octree node in the packed geometry octree; (2) a spatial location (xN, yN, zN) specifying the position of the current geometry octree node in the current slice; (3) a spatial location (xNBase, yNBase, zNBase) specifying the base position of the current geometry octree node in the current slice, where the geometry quantization with a QP is applied; and (4) a spatial location (xNQuant, yNQuant, zNQuant) specifying the quantized position of the current geometry octree node in the current slice, relative to the base position specified by (xNBase, yNBase, zNBase).

The outputs of this process are the modified array PointPos and the updated variable PointCount.

If neither depths are equal to MaxGeometryOctreeDepth−1, and the variable direct_mode_flag is equal to 0, no points are output by this process. Otherwise, if either depth is equal to MaxGeometryOctreeDepth−1, or the variable direct_mode_flag is equal to 1, the remainder of this process generates one or more point positions.

The spatial location of points in each occupied child can be determined according to the number of duplicate points in each child and the use of direct coded positions as follows:

```
for( child = 0; child < GeometryNodeChildrenCnt; child++) {
  childIdx = GeometryNodeChildren[ child ];
  x = 2 × xNBase + ( childIdx & 4 = = 1 );
  y = 2 × yNBase + ( childIdx & 2 = = 1 );
  z = 2 × zNBase + ( childIdx & 1 = = 1 );
  for( i = 0; i < GeometryNodeDupPoints[ child ] + 1 ; i++,
      PointCount++) {
    PointPos[ PointCount ][ 0 ] = (x * geoOctreeQS + (1 << 19))
        >> 20 + xNBase;
    PointPos[ PointCount ][ 1 ] = (y * geoOctreeQS + (1 << 19))
        >> 20 + yNBase;
    PointPos[ PointCount ][ 2 ] = (z * geoOctreeQS + (1 << 19))
        >> 20 + zNBase;
  }
  if( direct_mode_flag ) {
    for( i = 0; i <= num_direct_points_minus1; i++, PointCount++) {
      PointPos[ PointCount ][ 0 ] = ((x + PointOffsetX[ i ]) *
          geoOctreeQS + (1 << 19)) >> 20 + xNBase;
      PointPos[ PointCount ][ 1 ] = ((y + PointOffsetY[ i ]) *
          geoOctreeQS + (1 << 19)) >> 20 + yNBase;
      PointPos[ PointCount ][ 2 ] = ((z + PointOffsetZ[ i ]) *
          geoOctreeQS + (1 << 19)) >> 20 + zNBase;
    }
  }
}
```

11. Constraints to the Proposed Adaptive Geometry Quantization

According to aspects of the disclosure, the proposed adaptive geometry quantization can allow different quantization step sizes for different geometry octree nodes. Constraints may be introduced to the geometry quantization scheme to simplify the process.

In an embodiment, the adaptive geometry quantization is only allowed for the nodes at a specific partition depth.

In an embodiment, the quantization step sizes can only be numbers of a power of 2. In this case, the delta of quantization steps can be signaled in the form of log 2, and the implementation of quantization/de-quantization can be simplified by bit shifting.

In an embodiment, some geometry related coding tools may have interactions with the adaptive geometry quantization. To avoid the interactions, additional constraints may be utilized. For example, the planar coding mode can be disabled in some cases. In the embodiment where the adaptive geometry quantization is only allowed at a specific partition depth, the planar coding mode can be disabled at a depth above the specified depth.

V. Implicit Geometry Partition

This section presents implicit geometry partition. It describes how the two parameters K and M are updated and how the partition type and direction are decided based on K and M.

First, a controlling flag and two parameters K and M are specified in a geometry parameter set as shown in Table 32.

TABLE 32

| | Descriptor |
|---|---|
| geometry_parameter_set( ) { | |
| gps_geom_parameter_set_id | ue(v) |
| gps_seq_parameter_set_id | ue(v) |
| gps_box_present_flag | u(1) |
| if( gps_box_present_flag ){ | |
| gps_gsh_box_log2_scale_present_flag | u(1) |
| if( gps_gsh_box_log2_scale_present_flag == 0 ) | |
| gps_gsh_box_log2_scale | ue(v) |
| } | |
| unique_geometry_points_flag | u(1) |
| neighbour_context_restriction_flag | u(1) |
| inferred_direct_coding_mode_enabled_flag | u(1) |
| bitwise_occupancy_coding_flag | u(1) |
| adjacent_child_contextualization_enabled_flag | u(1) |
| log2_neighbour_avail_boundary | ue(v) |
| log2_intra_pred_max_node_size | ue(v) |
| log2_trisoup_node_size | ue(v) |
| gps_implicit_geom_partition_flag | u(1) |
| if ( gps_implicit_geom_partition_flag ) { | |
| gps_max_num_implicit_qtbt_before_ot | ue(v) |
| gps_min_size_implicit_qtbt | ue(v) |
| } | |
| gps_extension_present_flag | u(1) |
| if( gps_extension_present_flag ) | |
| while( more_data_in_byte_stream( ) ) | |
| gps_extension_data_flag | u(1) |
| byte_alignment( ) | |
| } | |

If the variable gps_implicit_geom_partition_flag equals 1, it specifies that the implicit geometry partition is enabled for the sequence or slice. If the variable gps_implicit_geom_partition_flag equals 0, it specifies that the implicit geometry partition is disabled for the sequence or slice. If the variable gps_implicit_geom_partition_flag equals 1, the following two parameters are signaled: (1) gps_max_num_implicit_qtbt_before_ot specifies the maximal number of implicit QT and BT partitions before OT partitions, i.e., K=gps_max_num_implicit_qtbt_before_ot; and (2) gps_min_size_implicit_qtbt specifies the minimal size of implicit QT and BT partitions, i.e., M=gps_min_size_implicit_qtbt.

This parameter prevents implicit QT and BT partitions when all dimensions are smaller than or equal to M.

If the implicit QTBT is enabled, the size of bounding box is specified by three values in geometry slice header as shown in Table 33.

TABLE 33

| | Descriptor |
|---|---|
| geometry_slice_header( ) { | |
| gsh_geometry_parameter_set_id | ue(v) |
| gsh_tile_id | ue(v) |
| gsh_slice_id | ue(v) |
| if( gps_box_present_flag ) { | |
| gsh_box_log2_scale | ue(v) |
| gsh_box_origin_x | ue(v) |
| gsh_box_origin_y | ue(v) |
| gsh_box_origin_z | ue(v) |
| } | |
| if ( gps_implicit_geom_partition_flag ) { | |
| gsh_log2_max_nodesize_x | ue(v) |
| gsh_log2_max_nodesize_y_minus_x | se(v) |
| gsh_log2_max_nodesize_z_minus_y | se(v) |
| } else { | |
| gsh_log2_max_nodesize | ue(v) |
| } | |
| gsh_num_points | ue(v) |
| byte_alignment( ) | |
| } | |

The variable gsh_log2_max_nodesize_x specifies the bounding box size in an x dimension, i.e., MaxNodeSizeXLog2 that is used in the decoding process as follows:
MaxNodeSizeXLog2=gsh_log2_max_nodesize_x,
MaxNodeSizeX=1<<MaxNodeSizeXLog2.

The variable gsh_log2_max_nodesize_y_minus_x specifies the bounding box size in a y dimension, i.e., MaxNodeSizeYLog2 that is used in the decoding process as follows:
MaxNodeSizeYLog2=gsh_log2_max_nodesize_y_minus_x+MaxNodeSizeXLog2,
MaxNodeSizeY=1<<MaxNodeSizeYLog2.

The variable gsh_log2_max_nodesize_z_minus_y specifies the bounding box size in a z dimension, i.e., MaxNodeSizeZLog2 that is used in the decoding process as follows:
MaxNodeSizeZLog2=gsh_log2_max_nodesize_z_minus_y+MaxNodeSizeYLog2,
MaxNodeSizeZ=1<<MaxNodeSizeZLog2.

The parameters K and M are then updated as follows,

```
gsh_log2_max_nodesize =
    max{ MaxNodeSizeXLog2,
    MaxNodeSizeYLog2,
    MaxNodeSizeZLog2}
gsh _log2_min_nodesize =
    min{ MaxNodeSizeXLog2,
    MaxNodeSizeYLog2,
    MaxNodeSizeZLog2}
if (K > (gsh_log2_max nodesize –
    gsh_log2_min_nodesize))
        K = gsh_log2_max_nodesize –
        gsh_log2_min_nodesize;
if (M > gsh_log2_min_nodesize)
    M = gsh_log2_min_nodesize;
if (gsh_log2_max_nodesize ==
    gsh_log2_min_nodesize)
        M = 0;
if (log2_trisoup_node_size !=0) {
    K = gsh_log2_max_nodesize –
    gsh_log2_min_nodesize;
    M = 0;
}
```

Exemplary modifications to the geometry slice data are shown in Table 34. Table 35 shows an exemplary syntax table.

TABLE 34

| | Descriptor |
|---|---|

```
geometry_slice_data( ) {
  depthX = 0; depthY = 0; depthZ = 0;
  for( depth = 0; depth < MaxGeometryOctreeDepth; depth++ ) {
    partitionSkip = implicit_qtbt_decison(K, M, depth, depthX, depthY, depthZ)
    for( nodeIdx = 0; nodeIdx < NumNodesAtDepth[ depth ]; nodeIdx++ ) {
      xN = NodeX[ depthX ][ nodeIdx ]
      yN = NodeY[ depthY ][ nodeIdx ]
      zN = NodeZ[ depthZ ][ nodeIdx ]
      geometry_node( depthX, depthY, depthZ, partitionSkip, nodeIdx, xN, yN,
zN )
    }
  }
  if ( log2_trisoup_node_size > 0 )
    geometry_trisoup_data( )
}
```

TABLE 35

| | Descriptor |
|---|---|

```
implicit_qtbt_decision ( K, M, depth, depthX, depthY, depthZ ) {
  partitionSkip = 0;
  NodeSizeXLog2 = MaxNodeSizeXLog2 – depthX;
  NodeSizeYLog2 = MaxNodeSizeYLog2 – depthY;
  NodeSizeZLog2 = MaxNodeSizeZLog2 – depthZ;
  MinNodeSizeLog2 = min{ NodeSizeXLog2, NodeSizeYLog2, NodeSizeZLog2};
  MaxNodeSizeLog2 = max{ NodeSizeXLog2, NodeSizeYLog2, NodeSizeZLog2};
  If (MinNodeSizeLog2 = = MaxNodeSizeLog2)
    M = 0;
  if (K > depth || M = = MinNodeSizeLog2) {
    if (NodeSizeXLog2 < MaxNodeSizeLog2)
      partitionSkip |= 4;
    if (NodeSizeYLog2 < MaxNodeSizeLog2)
      partitionSkip |= 2;
    if (NodeSizeZLog2 < MaxNodeSizeLog2)
      partitionSkip |= 1;
  }
  if ( !(partitionSkip & 4) )
    depthX = depthX + 1;
  if ( !(partitionSkip & 2) )
    depthY = depthY + 1;
  if ( !(partitionSkip & 1) )
    depthZ = depthZ + 1;
}
```

The variable MaxGeometryOctreeDepth is derived as follows:

MaxGeometryOctreeDepth=gsh_log2_max_nodesize− log2_trisoup_node_size

The variables NodeX[depthX][nodeIdx], NodeY[depthY][nodeIdx], and NodeZ[depthZ][nodeIdx] represent the x, y, and z coordinates of the nodeIdx-th node in decoding order at the given depth. The variable NumNodesAtDepth[depth] represents the number of nodes to be decoded at the given depth. The variables depthX, depthY, and depthZ specify the depth in the x, y and z dimensions, respectively. The variable partitionSkip specifies the partition type and direction as shown in Table 36. The variable partitionSkip is represented in binary form with three bits b_x b_y b_z, which specify whether to skip partition along the x, y and z dimension, respectively. For example, b_x=1 indicates no partition along the x dimension. Table 37 shows an exemplary syntax table.

TABLE 36

| Partition | QT along x-y axes | QT along x-z axes | QT along y-z axes | OT |
|---|---|---|---|---|
| partitionSkip | b001 | b010 | b100 | b000 |
| Partition | BT along x axis | BT along y axis | BT along z axis | |
| partitionSkip | b011 | b101 | b110 | |

TABLE 37

| | Descriptor |
|---|---|

```
geometry_node( depthX, depthY, depthZ, partitionSkip, nodeIdx, xN, yN, zN ) {
  if( NeighbourPattern = = 0 ) {
    single_occupancy_flag                                      ae(v)
```

TABLE 37-continued

| | Descriptor |
|---|---|
| if( single_occupancy_flag ) | |
| occupancy_idx | ae(v) |
| } | |
| if( !single_occupancy_flag ) | |
| if( bitwise_occupancy_flag ) | |
| occupancy_map | ae(v) |
| Else | |
| occupancy_byte | de(v) |
| if( depthX = = MaxNodeSizeXLog2 − 1 && | |
| depthY = = MaxNodeSizeYLog2 − 1 && | |
| depthZ = = MaxNodeSizeZLog2 − 1 ) | |
| if( !unique_geometry_points_flag ) | |
| for( child = 0; child <GeometryNodeChildrenCnt; child++ ) { | |
| num_points_eq1_flag [ child ] | ae(v) |
| if( !num_points_eq1_flag ) | |
| num_points_minus2 [ child ] | ae(v) |
| } | |
| } else { | |
| if( DirectModeFlagPresent ) | |
| direct_mode_flag | ae(v) |
| if( direct_mode_flag ) { | |
| num_direct_points_minus1 | ae(v) |
| for( i = 0; i <= num_direct_points_minus1; i++ ) | |
| for( j = 0; j < ChildNodeSizeXLog2; j++ ) { | |
| point_offset_x[ i ][ j ] | ae(v) |
| } | |
| for( j = 0; j < ChildNodeSizeYLog2; j++ ) { | |
| point_offset_y[ i ][ j ] | ae(v) |
| } | |
| for( j = 0; j < ChildNodeSizeZLog2; j++ ) { | |
| point_offset_z[ i ][ j ] | ae(v) |
| } | |
| } | |
| } | |
| } | |

The variables ChildNodeSizeXLog2, ChildNodeSizeYLog2 and ChildNodeSizeZLog2 specify the child node size for each dimension, and they are determined by implicit QT and BT partitions as follows,

```
NodeSizeXLog2 = MaxNodeSizeXLog2 − depthX;
NodeSizeYLog2 = MaxNodeSizeYLog2 − depthY;
NodeSizeZLog2 = MaxNodeSizeZLog2 − depthZ;
if( !(partitionSkip & 4)
   ChildNodeSizeXLog2 = NodeSizeXLog2 − 1;
else
   ChildNodeSizeXLog2 = NodeSizeXLog2;
if( !(partitionSkip & 2 )
   ChildNodeSizeYLog2 = NodeSizeYLog2 − 1;
else
   ChildNodeSizeYLog2 = NodeSizeYLog2;
if( !(partitionSkip & 1 )
   ChildNodeSizeZLog2 = NodeSizeZLog2 − 1;
else
   ChildNodeSizeZLog2 = NodeSizeZLog2;
```

VI. Parallel Octree Coding

In this section, the details of re-initialization of context and history variables in parallel octree coding are further described.

Let the octree partition depth be d=0, 1, . . . , M−1, where M is the total number of octree partition depths. In the following embodiments, the parallel octree coding is applied to the depths from $d_{min}$ to M−1, where $0 < d_{min} \leq M-1$, indicating the octree coding of those depths can be performed in parallel. In the following embodiments, the probabilities of the context variables and all the other related context and history variables in depth d ($d_{min} \leq d \leq M-1$) are reinitialized to be the same as those after coding the depth $d_{min}-1$, i.e., $P_d = P'_{d_{min}-1}$. In this case, the states of $P'_{d_{min}-1}$ need to be cached in advance for the rest octree partition depths.

When the octree partition reaches the specified depth the probability of context variables for bit-wise coding need to be stored in memory. For the remaining octree partition depths that would proceed in parallel, the probability of context variables needs to be reinitialized to be the same as the stored ones.

This process is invoked at the start of coding each octree depth.

if (gps_parallel_octree_coding_flag && depth==$d_{min}$)
 CtxMap is cached in entries CtxMapSvld[i]=CtxMap[i] for i in the range 0 to NumCtx−1.
if (gps_parallel_octree_coding_flag && depth>=$d_{min}$)
 CtxMap is restored in entries CtxMap[i]=CtxMapSvld[i] for i in the range 0 to NumCtx−1.
where NumCtx indicates the total number of contexts.

When the octree partition reaches the specified depth $d_{min}$, the values of look-up tables for byte-wise coding need to be stored in memory. For the remaining octree partition depths that would proceed in parallel, the values of look-up tables need to be reinitialized to be the same as the stored ones.

The related variables that need to be stored and recovered include: (1) an array of values lut0[k] storing the most frequent symbols, where k is in the range of 0 to 31, inclusive; (2) an array of values lut0Histogram[k] storing the symbols occurrences, where k is in the range of 0 to 255, inclusive; (3) two variables lut0UpdatePeriod and lut0SymbolsUntilUpdate storing the update period for lut0 and the number of symbols remaining until the next update, respectively; (4) a variable lut0Reset specifying whether lut0 should be reset during the next lut0 update or not; (5) an array of values lut1[k] storing the last 16 decoded symbols with different values, where k is in the range of 0 to 15, inclusive; (6) a variable lutlIndexLastSymbol storing the index of the last decoded symbol; (7) a set of adaptive binary arithmetic contexts ctxLut0Hit, ctxLut1Hit, and ctxSymbolBit; (8) an array of adaptive binary arithmetic contexts ctxLut0Index of size 5 if limitedContextMode equals 1, and 31 otherwise (i.e., limitedContextMode equals 0). The variable limitedContextMode specifies whether a limited number of contexts is used or not.

This re-initialization process is invoked at the start of coding each octree depth as follows,

```
if (gps_parallel_octree_coding_flag && depth == d_min) {
    for (k = 0; k < 32; k++)
        lut0Svld[k]= lut0[k];
    for (k = 0; k < 256; k++)
        lut0HistogramSvld[k]= lut0Histogram [k];
        lut0UpdatePeriodSvld = lut0UpdatePeriod;
        lut0SymbolsUntilUpdateSvld = lut0SymbolsUntilUpdate;
        lut0ResetSvld = lut0Reset;
    for (k = 0; k < 16; k++)
        lut1Svld[k]= lut1 [k];
        lut1IndexLastSymbolSvld = lut1IndexLastSymbol;
        ctxLut0HitSvld = ctxLut0Hit;
        ctxLut1HitSvld = ctxLut1Hit;
        ctxSymbolBitSvld = ctxSymbolBit;
    for (k = 0; k < 32; k++)
        ctxLut0IndexSvld[k] = ctxLut0Index[k];
}
if (gps_parallel_octree_coding_flag && depth >= d_min) {
    for (k = 0; k < 32; k++)
        lut0[k]= lut0Svld[k];
    for (k = 0; k < 256; k++)
        lut0Histogram [k]= lut0HistogramSvld [k];
        lut0UpdatePeriod = lut0UpdatePeriodSvld;
        lut0SymbolsUntilUpdate = lut0SymbolsUntilUpdateSvld;
        lut0Reset = lut0ResetSvld;
    for (k = 0; k < 16; k++)
        lut1 [k] = lut1Svld [k];
        lut1IndexLastSymbol = lut1IndexLastSymbolSvld;
        ctxLut0Hit = ctxLut0HitSvld;
        ctxLut1Hit = ctxLut1HitSvld;
        ctxSymbolBit = ctxSymbolBitSvld;
    for (k = 0; k < 32; k++)
        ctxLut0Index [k] = ctxLut0IndexSvld [k];
}
```

When the octree partition reaches the specified depth $d_{min}$, the history values for planar coding mode need to be stored in memory. For the remaining octree partition depths that would proceed in parallel, the history values need to be reinitialized to be the same as the stored ones.

This re-initialization process is invoked at the start of coding each octree depth as follows,

```
if (gps_parallel_octree_coding_flag && depth == d_min) {
    localDensitySvld = localDensity;
    for (axisIdx = 0; k < 2; k++) {
        planeRateSvld [axisIdx] = planeRate [axisIdx];
    }
}
if (gps_parallel_octree_coding_flag && depth >= d_min) {
    localDensity = localDensitySvld;
    for (axisIdx =0; k < 2 ; k++) {
        planeRate [axisIdx]= planeRateSvld [axisIdx];
    }
}
```

In one embodiment, the minimal octree depth that enables parallel octree coding, i.e., d_min, is specified by gps_parallel_octree_coding_max_nodesize_log2_minus1 in the geometry parameter set in TMC13 as shown in Table 38.

TABLE 38

| | Descriptor |
|---|---|
| geometry_parameter_set( ){ | |
|   gps_geom_parameter_set_id | ue(v) |
|   ... | ... |
|   log2_trisoup_node_size | ue(v) |
|   gps_parallel_octree_coding_max_nodesize_log2_minus1 | ue(v) |
|   ... | ... |
|   byte_alignment( ) | |
| } | |

The variable gps_parallel_octree_coding_max_nodesize_log2 specifies the minimal octree depth that enables parallel octree coding, i.e., $d_{min}$, as follows, $d_{min}$=M-gps_parallel_octree_coding_max_nodesize_log2_minus1−1.

In this case, the variable gps_parallel_octree_coding_flag is not signaled but can be inferred from the variable gps_parallel_octree_coding_max_nodesize_log2_minus1.

If the variable gps_parallel_octree_coding_max_nodesize_log2_minus1 equals zero, the variable gps_parallel_octree_coding_flag is inferred to be 0. Otherwise, the variable gps_parallel_octree_coding_flag is inferred to be 1.

VII. Flowchart

Figure 11:
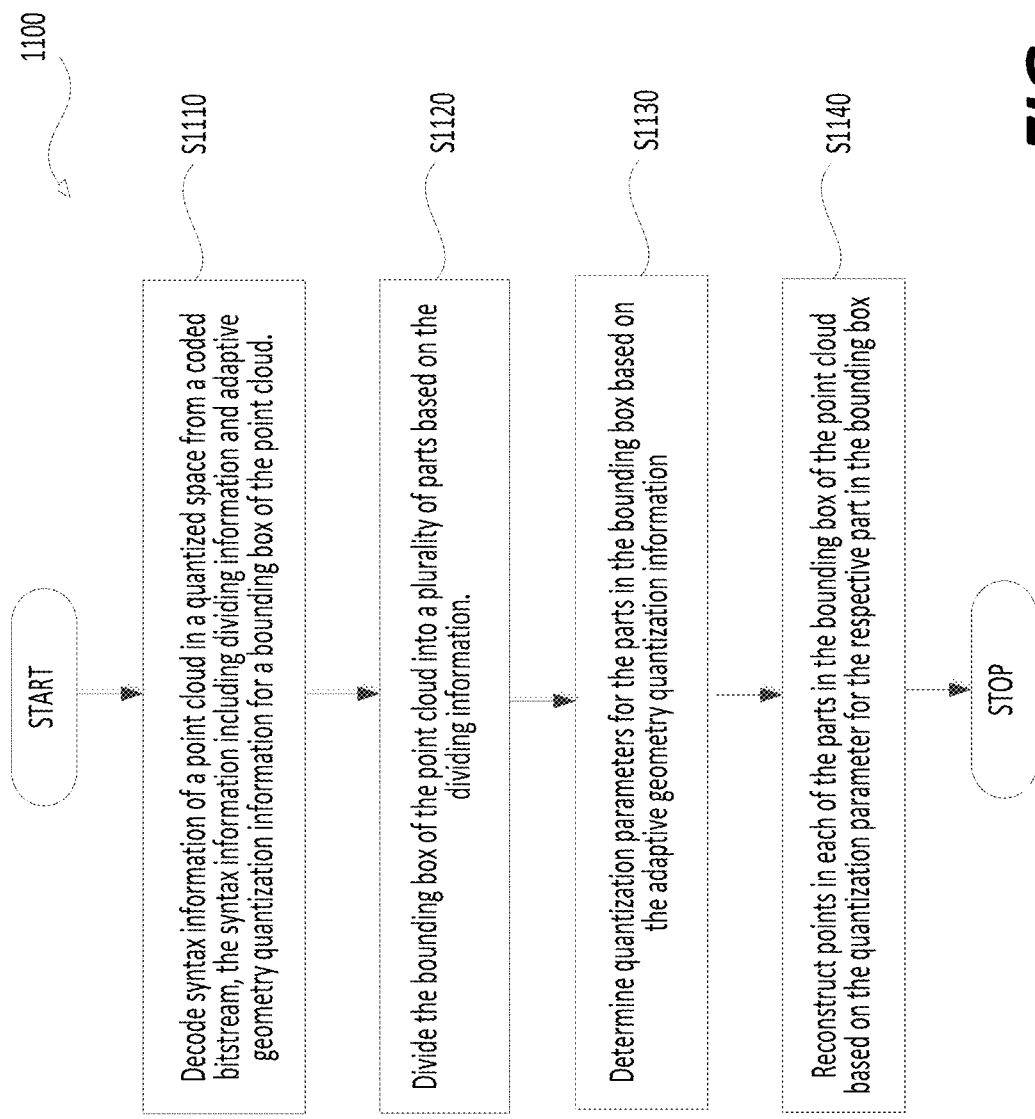
FIG. 11 shows a flow chart outlining a process example according to an embodiment of the disclosure.

FIG. 11 shows a flow chart outlining a process (1100) according to an embodiment of the disclosure. The process (1100) can be used during an encoding process for encoding point clouds. In various embodiments, the process (1100) is executed by processing circuitry, such as the processing circuitry in the terminal devices (110), the processing circuitry that performs functions of the encoder (203), the processing circuitry that performs functions of the encoder (300), and the like. In some embodiments, the process (1100) is implemented in software instructions, thus when the processing circuitry executes the software instructions, the processing circuitry performs the process (1100), which may start at (S1110).

At (S1110), the process (1100) decodes syntax information of a point cloud in a quantized space from a coded bitstream. The syntax information includes dividing information and adaptive geometry quantization information for a bounding box of the point cloud. Then the process (1100) proceeds to step (S1120).

At (S1120), the process (1100) divides the bounding box of the point cloud into a plurality of parts based on the dividing information. The parts can correspond to partitions or regions, as described above. Then the process (1100) proceeds to step (S1130).

At (S1130), the process (1100) determines quantization parameters for the parts in the bounding box based on the adaptive geometry quantization information. Then the process (1100) proceeds to step (S1140).

At (S1140), the process (1100) reconstructs points in each of the parts in the bounding box of the point cloud based on the quantization parameter for the respective part in the bounding box. Then, the process (1100) terminates.

In an embodiment, the bounding box is divided into a plurality of partitions based on an octree partition structure included in the dividing information.

In an embodiment, the bounding box is divided into a plurality of regions based on coordinate information of the plurality of regions included in the dividing information.

In an embodiment, the quantization parameters are determined based on a base quantization parameter included in the adaptive geometry quantization information.

In an embodiment, the quantization parameters are determined based on one or more delta quantization parameters in response to a first syntax element indicating that signaling of the one or more delta quantization parameters is enabled. The first syntax element is included in the adaptive geometry quantization information.

In an embodiment, the adaptive geometry quantization information includes one of a second syntax element and a third syntax element based on the first syntax element indicating that the signaling of the one or more delta quantization parameters is enabled. The second syntax element indicates an octree partition depth at which the signaling of the one or more delta quantization parameters is allowed, and the third syntax element indicates a minimum octree partition depth from which the signaling of the one or more delta quantization parameters is allowed.

In an embodiment, at least one of the quantization parameters, the base quantization parameter, and the one or more delta quantization parameters is a power of two.

In an embodiment, one of (i) the quantization parameters and (ii) the one or more delta quantization parameters is included in a look-up table.

In an embodiment, the adaptive geometry quantization information includes one of (i) an index of the look-up table and (ii) a difference between the index and a predictor of the index.

In an embodiment, a delta quantization parameter of each part in the bounding box is predicted based on at least one of a quantization parameter of a parent node of a node corresponding to the respective part, a quantization parameter of a previously coded sibling node of the node corresponding to the respective part in a same partition depth, and the base quantization parameter.

In an embodiment, the one or more delta quantization parameters are predicted based on a candidate list of quantization parameter predictors.

VIII. Computer System

The techniques described above, can be implemented as computer software using computer-readable instructions and physically stored in one or more computer-readable media. For example, FIG. 12 shows a computer system (1200) suitable for implementing certain embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by one or more computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

Figure 12:
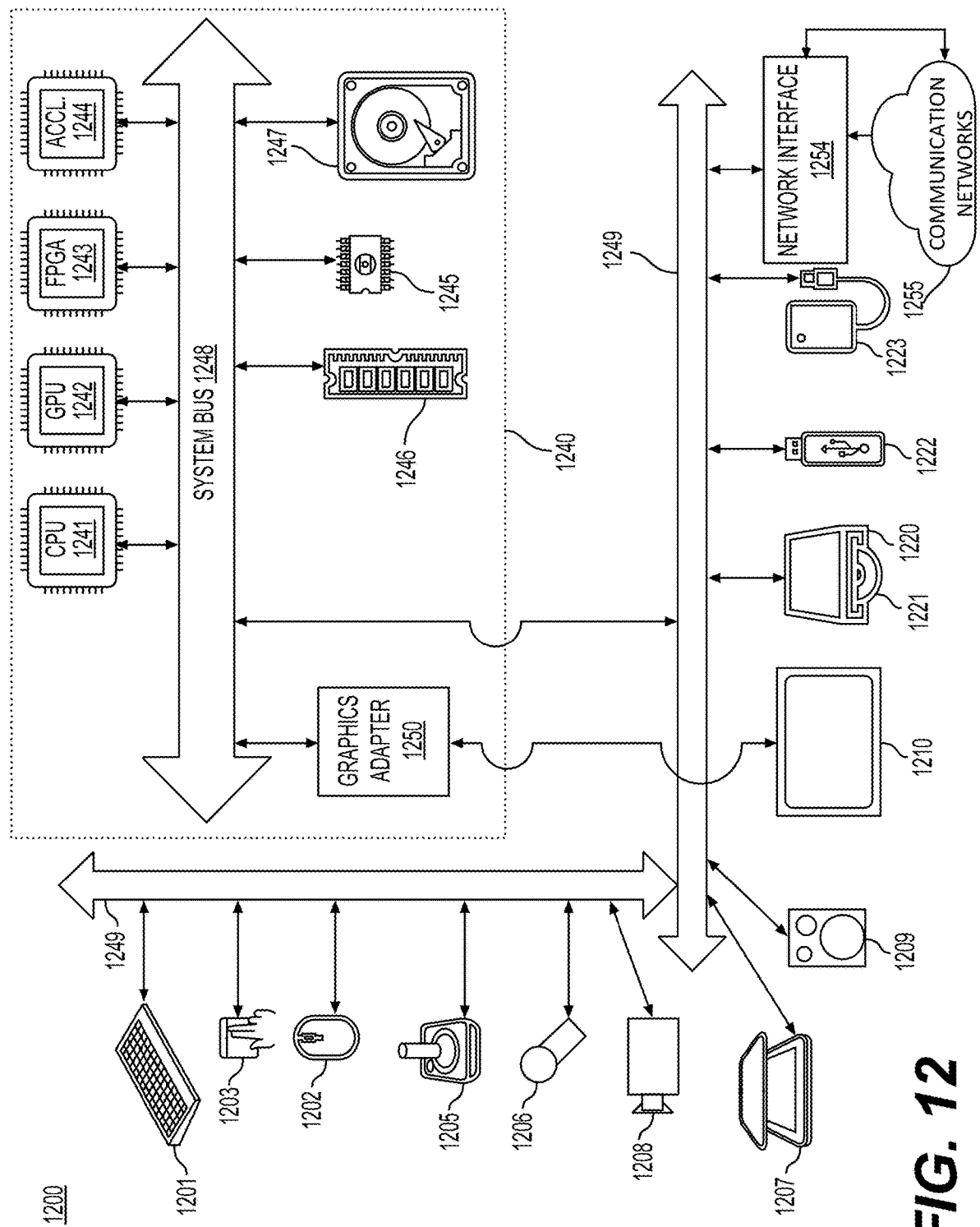
FIG. 12 shows a schematic illustration of a computer system according to an embodiment of the disclosure.

The components shown in FIG. 12 for computer system (1200) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (1200).

Computer system (1200) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (1201), mouse (1202), trackpad (1203), touch screen (1210), data-glove (not shown), joystick (1205), microphone (1206), scanner (1207), camera (1208).

Computer system (1200) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (1210), data-glove (not shown), or joystick (1205), but there can also be tactile feedback devices that do not serve as input devices), audio output devices (such as: speakers (1209), headphones (not depicted)), visual output devices (such as screens (1210) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (1200) can also include human accessible storage devices and their associated media such as optical media including CD/DVD ROM/RW (1220) with CD/DVD or the like media (1221), thumb-drive (1222), removable hard drive or solid state drive (1223), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (1200) can also include an interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (1249) (such as, for example USB ports of the computer system (1200)); others are commonly integrated into the core of the computer system (1200) by attachment to a system bus as described below (for example Ethernet interface into a PC computer system or cellular network interface into a smartphone computer system). Using any of these networks, computer system (1200) can communicate with other entities. Such communication can be uni-directional, receive only (for example, broadcast TV), uni-directional send-only (for example CANbus to certain CANbus devices), or bi-directional, for example to other computer systems using local or wide area digital networks. Certain protocols and protocol stacks can be used on each of those networks and network interfaces as described above.

Aforementioned human interface devices, human-accessible storage devices, and network interfaces can be attached to a core (1240) of the computer system (1200).

The core (1240) can include one or more Central Processing Units (CPU) (1241), Graphics Processing Units (GPU) (1242), specialized programmable processing units in the form of Field Programmable Gate Areas (FPGA) (1243), hardware accelerators for certain tasks (1244), and so forth. These devices, along with Read-only memory (ROM) (1245), Random-access memory (1246), internal mass storage such as internal non-user accessible hard drives, SSDs, and the like (1247), may be connected through a system bus (1248). In some computer systems, the system bus (1248) can be accessible in the form of one or more physical plugs to enable extensions by additional CPUs, GPU, and the like. The peripheral devices can be attached either directly to the core's system bus (1248), or through a peripheral bus (1249). Architectures for a peripheral bus include PCI, USB, and the like.

CPUs (1241), GPUs (1242), FPGAs (1243), and accelerators (1244) can execute certain instructions that, in combination, can make up the aforementioned computer code. That computer code can be stored in ROM (1245) or RAM (1246). Transitional data can be also be stored in RAM (1246), whereas permanent data can be stored for example, in the internal mass storage (1247). Fast storage and retrieve to any of the memory devices can be enabled through the use of cache memory, that can be closely associated with one or more CPU (1241), GPU (1242), mass storage (1247), ROM (1245), RAM (1246), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (1200), and specifically the core (1240) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (1240) that are of non-transitory nature, such as core-internal mass storage (1247) or ROM (1245). The software implementing various embodiments of the present disclosure can be stored in such devices and executed by core (1240). A computer-readable medium can include one or more memory devices or chips, according to particular needs. The software can cause the core (1240) and specifically the processors therein (including CPU, GPU, FPGA, and the like) to execute particular processes or particular parts of particular processes described herein, including defining data structures stored in RAM (1246) and modifying such data structures according to the processes defined by the software. In addition or as an alternative, the computer system can provide functionality as a result of logic hardwired or otherwise embodied in a circuit (for example: accelerator (1244)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several exemplary embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method for point cloud coding in a decoder, comprising:
decoding syntax information of a point cloud in a quantized space from a coded bitstream, the syntax information including dividing information and adaptive geometry quantization information for a bounding box of the point cloud;
dividing the bounding box of the point cloud into a plurality of parts based on the dividing information;
determining quantization parameters for the parts in the bounding box based on the adaptive geometry quantization information; and
reconstructing points in each of the parts in the bounding box of the point cloud based on the quantization parameter for the respective part in the bounding box.

2. The method of claim 1, wherein
the dividing information includes an octree partition structure, and
the dividing includes dividing the bounding box into a plurality of partitions based on the octree partition structure.

3. The method of claim 1, wherein
the dividing information includes coordinate information of a plurality of regions, and
the dividing includes dividing the bounding box into the plurality of regions based on the coordinate information.

4. The method of claim 1, wherein
the adaptive geometry quantization information includes a base quantization parameter, and
the determining includes determining the quantization parameters based on the base quantization parameter.

5. The method of claim 1, wherein
the adaptive geometry quantization information includes a first syntax element indicating whether signaling of one or more delta quantization parameters is enabled, and
the determining includes determining the quantization parameters based on the one or more delta quantization parameters in response to the first syntax element indicating that the signaling of the one or more delta quantization parameters is enabled.

6. The method of claim 5, wherein the adaptive geometry quantization information includes one of a second syntax element and a third syntax element based on the first syntax element indicating that the signaling of the one or more delta quantization parameters is enabled, the second syntax element indicating an octree partition depth at which the signaling of the one or more delta quantization parameters is allowed, and the third syntax element indicating a minimum octree partition depth from which the signaling of the one or more delta quantization parameters is allowed.

7. The method of claim 5, wherein at least one of the quantization parameters, the base quantization parameter, and the one or more delta quantization parameters is a power of two.

8. The method of claim 5, wherein one of (i) the quantization parameters and (ii) the one or more delta quantization parameters is included in a look-up table.

9. The method of claim 8, wherein the adaptive geometry quantization information includes one of (i) an index of the look-up table and (ii) a difference between the index and a predictor of the index.

10. The method of claim 5, wherein a delta quantization parameter of each part in the bounding box is predicted based on at least one of a quantization parameter of a parent node of a node corresponding to the respective part, a quantization parameter of a previously coded sibling node of the node corresponding to the respective part in a same partition depth, and the base quantization parameter.

11. The method of claim 5, wherein the one or more delta quantization parameters are predicted based on a candidate list of quantization parameter predictors.

12. An apparatus for point cloud coding, comprising processing circuitry configured to:
    decode syntax information of a point cloud in a quantized space from a coded bitstream, the syntax information including dividing information and adaptive geometry quantization information for a bounding box of the point cloud;
    divide the bounding box of the point cloud into a plurality of parts based on the dividing information;
    determine quantization parameters for the parts in the bounding box based on the adaptive geometry quantization information; and
    reconstruct points in each of the parts in the bounding box of the point cloud based on the quantization parameter for the respective part in the bounding box.

13. The apparatus of claim 12, wherein the processing circuitry is further configured to:
    divide the bounding box into a plurality of partitions based on an octree partition structure included in the dividing information.

14. The apparatus of claim 12, wherein the processing circuitry is further configured to:
    divide the bounding box into a plurality of regions based on coordinate information of the plurality of regions included in the dividing information.

15. The apparatus of claim 12, wherein the processing circuitry is further configured to:
    determine the quantization parameters based on a base quantization parameter included in the adaptive geometry quantization information.

16. The apparatus of claim 12, wherein the processing circuitry is further configured to:
    determine the quantization parameters based on one or more delta quantization parameters in response to a first syntax element indicating that signaling of the one or more delta quantization parameters is enabled, the first syntax element being included in the adaptive geometry quantization.

17. The apparatus of claim 16, wherein the adaptive geometry quantization information includes one of a second syntax element and a third syntax element based on the first syntax element indicating that the signaling of the one or more delta quantization parameters is enabled, the second syntax element indicating an octree partition depth at which the signaling of the one or more delta quantization parameters is allowed, and the third syntax element indicating a minimum octree partition depth from which the signaling of the one or more delta quantization parameters is allowed.

18. The apparatus of claim 16, wherein at least one of the quantization parameters, the base quantization parameter, and the one or more delta quantization parameters is a power of two.

19. The apparatus of claim 16, wherein one of (i) the quantization parameters and (ii) the one or more delta quantization parameters is included in a look-up table.

20. A non-transitory computer-readable medium storing instructions which when executed by a computer for point cloud coding cause the computer to perform:
    decoding syntax information of a point cloud in a quantized space from a coded bitstream, the syntax information including dividing information and adaptive geometry quantization information for a bounding box of the point cloud;
    dividing the bounding box of the point cloud into a plurality of parts based on the dividing information;
    determining quantization parameters for the parts in the bounding box based on the adaptive geometry quantization information; and
    reconstructing points in each of the parts in the bounding box of the point cloud based on the quantization parameter for the respective part in the bounding box.

* * * * *